(12) United States Patent
Fukazawa et al.

(10) Patent No.: US 12,251,768 B2
(45) Date of Patent: Mar. 18, 2025

(54) CUTTING APPARATUS

(71) Applicant: DISCO CORPORATION, Tokyo (JP)

(72) Inventors: Takashi Fukazawa, Tokyo (JP); Satoshi Sawaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 336 days.

(21) Appl. No.: 18/061,710

(22) Filed: Dec. 5, 2022

(65) Prior Publication Data

US 2023/0191511 A1 Jun. 22, 2023

(30) Foreign Application Priority Data

Dec. 21, 2021 (JP) ................................. 2021-206616

(51) Int. Cl.
*B23D 59/00* (2006.01)
*H01L 21/67* (2006.01)
*B28D 5/02* (2006.01)

(52) U.S. Cl.
CPC ...... *B23D 59/002* (2013.01); *H01L 21/67092* (2013.01); *B28D 5/022* (2013.01)

(58) Field of Classification Search
CPC ............................ B23D 59/002; B23D 59/001
See application file for complete search history.

(56) References Cited

U.S. PATENT DOCUMENTS

| | | | | |
|---|---|---|---|---|
| 6,681,672 B2* | 1/2004 | Myrfield | .............. | B23Q 15/013 715/833 |
| 7,853,349 B2* | 12/2010 | Barker | .................... | B27B 31/06 144/392 |
| 7,886,642 B2* | 2/2011 | Barker | .................... | B23Q 17/24 144/357 |
| 8,346,631 B2* | 1/2013 | Barker | .................... | B23Q 17/20 705/28 |
| 8,677,871 B2* | 3/2014 | Van Laar | ................. | B26D 1/18 83/72 |
| 9,073,134 B2* | 7/2015 | Koeder | .................. | B23D 51/16 |
| 9,505,072 B2* | 11/2016 | Barker | .................... | B27B 1/007 |
| 9,873,158 B2* | 1/2018 | Koegel | ................ | B23D 59/002 |
| 10,245,660 B2* | 4/2019 | Myrfield | ............. | B23D 59/002 |

(Continued)

FOREIGN PATENT DOCUMENTS

JP 04179505 A 6/1992

*Primary Examiner* — Sean M Michalski
(74) *Attorney, Agent, or Firm* — Greer Burns & Crain Ltd.

(57) ABSTRACT

A cutting apparatus for cutting a workpiece includes a chuck table having a holding surface for holding the workpiece thereon, a cutting unit having a spindle with a cutting blade mounted on a distal end thereof for cutting the workpiece held on the holding surface, an image capturing unit for capturing an image of an outer circumferential portion of the cutting blade mounted on the cutting unit, and a determining section for determining the orientation of the cutting blade. The outer circumferential portion of the cutting blade includes a plurality of protrusions each having a first surface for scraping swarf off from the workpiece when the cutting blade cuts the workpiece and a second surface connected to the first surface. The determining section determines the orientation of the cutting blade mounted on the cutting unit, according to an image captured of the protrusions by the image capturing unit.

4 Claims, 11 Drawing Sheets

(56) References Cited

U.S. PATENT DOCUMENTS

| | | | | |
|---|---|---|---|---|
| 2010/0147124 A1* | 6/2010 | Seidel | ................. | F16P 3/12 |
| | | | | 83/72 |
| 2011/0067248 A1* | 3/2011 | Koeder | ................ | B23D 59/002 |
| | | | | 30/289 |
| 2011/0113939 A1* | 5/2011 | Simon | ................ | F16P 3/142 |
| | | | | 83/563 |
| 2012/0227271 A1* | 9/2012 | Krieger | ................ | B23D 51/02 |
| | | | | 30/374 |
| 2014/0130643 A1* | 5/2014 | Dammertz | ........... | B23D 59/001 |
| | | | | 83/365 |
| 2014/0318342 A1* | 10/2014 | Koegel | ................ | B27G 19/02 |
| | | | | 83/477.1 |
| 2015/0158097 A1* | 6/2015 | Myrfield | ................ | B27B 15/04 |
| | | | | 83/403.1 |

\* cited by examiner

CUTTING APPARATUS

BACKGROUND OF THE INVENTION

Field of the Invention

The present invention relates to a cutting apparatus for cutting a workpiece.

Description of the Related Art

Wafers with a plurality of devices constructed thereon are divided into a plurality of individual pieces as device chips that include the respective devices. Alternatively, a plurality of device chips are mounted on a base substrate and encapsulated by an encapsulant of resin, i.e., a molding resin, to produce a packaged substrate. The packaged substrate is then divided into a plurality of individual pieces as packaged devices that include the respective packaged device chips. The device chips and the packaged devices will be incorporated in various electronic appliances such as cell phones and personal computers.

Cutting apparatuses are usually used to divide such workpieces as wafers and packaged substrates. A cutting apparatus includes a chuck table for holding a workpiece thereon and a cutting unit for cutting the workpiece on the chuck table. The cutting unit houses a rotatable spindle therein, and an annular cutting blade is mounted on the distal end of the spindle. The cutting apparatus operates as follows: The chuck table holds the workpiece thereon and is then moved relative to the cutting unit, i.e., processing-fed with respect to the cutting unit, while the cutting blade is being rotated about its central axis by the spindle. The cutting blade cuts into the workpiece, dividing the workpiece into individual pieces.

The cutting blade has its structure, material, and other details selected depending on the material, properties, etc., of the workpiece to be cut by it. For example, if the workpiece to be cut and divided by the cutting blade is shaped as a plate made of raw ceramic, then the cutting blade has a plurality of saw-toothed protrusions on its outer circumferential edge (see Japanese Patent Laid-open No. Hei 4-179505).

SUMMARY OF THE INVENTION

For cutting a workpiece with a cutting blade having a plurality of saw-toothed protrusions, the cutting blade is mounted on a cutting unit in a predetermined orientation. Specifically, each of the saw-toothed protrusions has a rake surface and a flank surface, and the cutting blade is mounted on the distal end of a rotatable spindle such that the rake surface is positioned forwardly of the flank surface in the direction of rotation of the cutting blade.

When the operator is to install the cutting blade on the cutting unit, the operator is required to visually recognize the orientation of minute saw-toothed protrusions and mount the cutting blade in a predetermined orientation taking into account the direction in which the chuck table will be processing-fed with respect to the cutting unit to cut the workpiece. In view of these requirements, the operator is highly likely to install the cutting blade in a wrong orientation. If the cutting blade installed in the wrong orientation is used to cut the workpiece continuously, then the workpiece is not cut as intended by the operator, possibly causing processing failures.

For cutting a workpiece, there may be used what is generally called a dual-spindle-type cutting apparatus having a pair of cutting units with a pair of cutting blades mounted respectively thereon in facing relation to each other. In the dual-spindle-type cutting apparatus, the orientations of the cutting blades with respect to respective spindles are different from each other on the respective cutting units. Hence, the operator is apt to misunderstand the correct orientations of the cutting blades and more likely to install the cutting blades in error.

The present invention has been made in view of the above difficulties. It is an object of the present invention to provide a cutting apparatus capable of preventing processing failures from occurring due to a cutting blade installed in error.

In accordance with an aspect of the present invention, there is provided a cutting apparatus for cutting a workpiece, including a chuck table having a holding surface for holding the workpiece thereon, a cutting unit having a spindle with a cutting blade mounted on a distal end thereof for cutting the workpiece held on the holding surface, an image capturing unit for capturing an image of an outer circumferential portion of the cutting blade mounted on the cutting unit, and a determining section for determining the orientation of the cutting blade. In the cutting apparatus, the outer circumferential portion of the cutting blade includes a plurality of protrusions each having a first surface for scraping swarf off from the workpiece when the cutting blade cuts the workpiece and a second surface connected to the first surface, and the determining section determines the orientation of the cutting blade mounted on the cutting unit, according to an image captured of the protrusions by the image capturing unit.

Preferably, the determining section determines the orientation of the cutting blade according to dimensions of the first surface and the second surface of the protrusions in the image thereof captured by the image capturing unit. Preferably, the determining section alternatively determines the orientation of the cutting blade according to inclinations of the first surface and the second surface of the protrusions in the image thereof captured by the image capturing unit. Preferably, the determining section alternatively determines the orientation of the cutting blade according to the result of a comparison between the image captured of the protrusions by the image capturing unit and a reference image.

The cutting apparatus according to the above aspect of the present invention is capable of determining the orientation of the cutting blade according to the image captured of the protrusions by the image capturing unit. The workpiece is thus prevented from being continuously cut by the cutting blade that is mounted in a wrong orientation on the cutting unit, thereby preventing processing failures from occurring due to the cutting blade installed in the wrong orientation.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
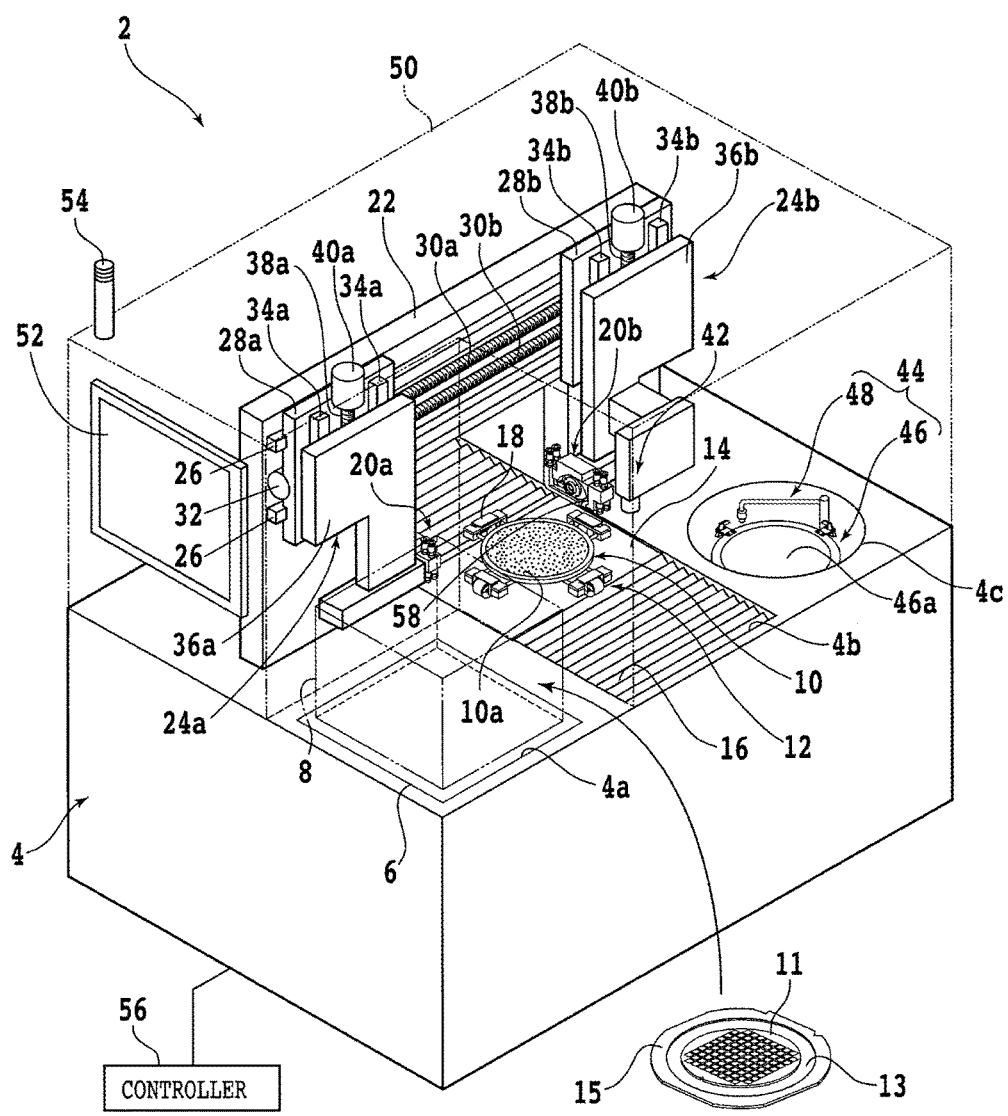
FIG. 1 is a perspective view of a cutting apparatus according to a preferred embodiment of the present invention.

A cutting apparatus according to a preferred embodiment of the present invention will be described in detail hereinbelow with reference to the accompanying drawings. First, structural details of the cutting apparatus according to the present embodiment will be described below. FIG. 1 illustrates in perspective the cutting apparatus, denoted by 2, for cutting a workpiece 11. In FIG. 1, the cutting apparatus 2 is illustrated in reference to a three-dimensional coordinate system having an X-axis, a Y-axis, and a Z-axis. X-axis directions, i.e., processing feed directions, first horizontal directions, or forward and rearward directions, along the X-axis, and Y-axis directions, i.e., indexing feed directions, second horizontal directions, or leftward and rightward directions, along the Y-axis are perpendicular to each other. Z-axis directions, i.e., vertical directions, upward and downward directions, or heightwise directions, along the Z-axis are perpendicular to the X-axis and Y-axis directions. Coordinates that will be described later with respect to the cutting apparatus 2 belong to the three-dimensional coordinate system.

As illustrated in FIG. 1, the cutting apparatus 2 includes a base 4 shaped as a rectangular parallelepiped supporting thereon and housing therein various components of the cutting apparatus 2. The base 4 has a rectangular opening 4a defined in a corner of a front end portion thereof and open upwardly in an upper surface of the base 4. The opening 4a accommodates therein a cassette support table 6 that can be lifted and lowered by an unillustrated lifting and lowering mechanism. The cassette support table 6 can support thereon a cassette 8 that houses a plurality of workpieces 11 to be processed, i.e., cut, by the cutting apparatus 2. In FIG. 1, the cassette 8 has its contour indicated by the two-dot-and-dash lines.

Each of the workpieces 11 is, for example, a disk-shaped wafer made of a semiconductor material such as monocrystalline silicon, and has a face side and a reverse side that lie generally parallel to each other. The workpiece 11 has a plurality of rectangular areas demarcated by a plurality of streets or projected dicing lines arrayed in a grid pattern in crisscross relation. A plurality of devices are constructed on the face side, illustrated as facing downwardly, of the workpiece 11 in the respective areas demarcated by the streets. The devices may be integrated circuits (ICs), large-scale-integration (LSI) circuits, light-emitting diodes (LEDs), microelectromechanical systems (MEMS) devices, or the like, for example.

A tape, i.e., a dicing tape, 13 is affixed to the reverse side, facing downwardly, of the workpiece 11. The tape 13 includes a circular film, i.e., a base layer, larger in diameter than the workpiece 11 and an adhesive layer, i.e., a glue layer, on the base layer. The base layer is made of such resin as polyolefin, polyvinyl chloride, or polyethylene terephthalate, whereas the adhesive layer is made of an epoxy-based, acryl-based, or rubber-based adhesive. The adhesive layer may alternatively be made of an ultraviolet-curable resin that can be cured upon being exposed to ultraviolet rays.

The tape 13 has an outer circumferential portion affixed to an annular frame 15 made of a metal material or the like. The frame 15 has a circular opening defined centrally therein and extending vertically or thicknesswise therethrough. The opening of the frame 15 is larger in diameter than the workpiece 11, so that the workpiece 11 is disposed within the workpiece of the frame 15. When a central portion of the tape 13 is affixed to the workpiece 11 and the outer circumferential portion of the tape 13 is affixed to the frame 15, the workpiece 11 is supported on the frame 15 by the tape 13.

The workpieces 11 housed in the cassette 8 are supported on respective annular frames 15 by respective tapes 13. The workpieces 11 as supported by the annular frames 15 by the tapes 13 will be taken out of the cassette 8 and will be cut on the cutting apparatus 2. The cutting apparatus 2 cuts each workpiece 11 along the streets into a plurality of device chips each including devices. The workpiece 11 is not limited to any particular kinds, materials, shapes, structures, sizes, etc. The workpiece 11 may be, for example, a substrate or a wafer made of a semiconductor such as gallium arsenide (GaAs), indium phosphide (InP), gallium nitride (GaN), or silicon carbide (SiC) other than silicon, glass, sapphire, ceramic, resin, metal, or the like. The devices are not limited to any particular kinds, numbers, shapes, structures, sizes, layouts, etc. The workpiece 11 may be free of devices. The workpiece 11 may be a packaged substrate such as a chip size package (CSP) substrate or a quad flat non-leaded package (QFN) substrate. For example, a packaged substrate is produced by a plurality of device chips mounted on a base substrate being encapsulated with a resin layer, i.e., a molding resin layer. Then, the packaged substrate is divided into individual pieces as a plurality of packaged devices having the respective device chips.

The base 4 also has an oblong rectangular opening 4b defined therein alongside the opening 4a and open upwardly in the upper surface of the base 4. The opening 4b has a longitudinal axis extending in the X-axis directions. The opening 4b accommodates therein a chuck table, i.e., a holding table, 10 for holding a workpiece 11 thereon. The chuck table 10 has an upper surface lying flatwise generally parallel to a horizontal plane, i.e., an XY plane, extending along the X- and Y-axes. The upper surface of the chuck table 10 acts as a holding surface 10*a* for holding the workpiece 11 thereon. The holding surface 10*a* is fluidly connected to an unillustrated suction source such as an ejector through an unillustrated suction channel defined in the chuck table 10, an unillustrated valve, etc.

The chuck table 10 is combined with a moving mechanism 12 disposed in the base 4 for moving the chuck table 10 along the X-axis directions. The moving mechanism 12 is a ball-screw-type moving mechanism and includes an unillustrated X-axis ball screw extending along the X-axis directions and an unillustrated X-axis stepping motor for rotating the X-axis ball screw about its horizontal central axis parallel to the X-axis. The moving mechanism 12 has a table cover 14 shaped as a flat plate surrounding the chuck table 10. A bellows-like dust-resistant, drop-proof cover 16 that is flexibly extensible and contractible along the X-axis directions is disposed in the opening 4*b* forwardly and rearwardly of the table cover 14. The table cover 14 and the dust-resistant, drop-proof cover 16 disposed in the opening 4*b* cover the components, i.e., the X-axis ball screw, the X-axis stepping motor, etc., of the moving mechanism 12.

The chuck table 10 is coupled to an unillustrated rotary actuator such as an electric motor for rotating the chuck table 10 about its vertical central axis generally parallel to the Z-axis. The chuck table 10 is surrounded by a plurality of clamps 18 mounted on the table cover 14 for gripping and securing the frame 15 that supports the workpiece 11 on the chuck table 10.

An unillustrated delivery mechanism is disposed on the base 4 in the vicinity of the openings 4*a* and 4*b* for delivering a workpiece 11 between the cassette 8 and the chuck table 10. The delivery mechanism removes a workpiece 11 from the cassette 8 and delivers the workpiece 11 to the chuck table 10 where the workpiece 11 is placed on the holding surface 10*a* with the tape 13 interposed therebetween. The frame 15 is then gripped by the clamps 18 and secured in position. Then, a suction force, i.e., a negative pressure, generated and transmitted from the suction source is applied through the valve and the suction channel to the holding surface 10*a*, holding the workpiece 11 under suction on the chuck table 10.

A cutting unit, i.e., a first cutting unit, 20*a*, and a cutting unit, i.e., a second cutting unit, 20*b*, are disposed above the chuck table 10 and supported on a portal-shaped support structure 22. The support structure 22 that supports the cutting units 20*a* and 20*b* is disposed on the upper surface of the base 4 and extends across and over the opening 4*b*. The support structure 22 supports a pair of moving mechanisms 24*a* and 24*b* on a front surface thereof at respective opposite side portions thereof. The moving mechanism 24*a* is a ball-screw-type moving mechanism for moving the cutting unit 20*a* along the Y-axis directions and the Z-axis directions. The moving mechanism 24*b* is a ball-screw-type moving mechanism for moving the cutting unit 20*b* along the Y-axis directions and the Z-axis directions. The moving mechanisms 24*a* and 24*b* are mounted on a pair of Y-axis guide rails 26 mounted on the front surface of the support structure 22 and extending along the Y-axis directions.

The moving mechanism 24*a* includes a flat Y-axis movable plate 28*a* slidably mounted on the Y-axis guide rails 26. An unillustrated nut is mounted on a reverse side, i.e., a rear surface, of the Y-axis movable plate 28*a*. The nut is operatively threaded over a Y-axis ball screw 30*a* disposed between and extending generally parallel to the Y-axis guide rails 26. The Y-axis ball screw 30*a* has an end coupled to a Y-axis stepping motor 32 for rotating the Y-axis ball screw 30*a* about its horizontal central axis. When the Y-axis stepping motor 32 is energized, it rotates the Y-axis ball screw 30*a* about its horizontal central axis, causing the nut to move the Y-axis movable plate 28*a* in one of the Y-axis directions along the Y-axis guide rails 26. A pair of Z-axis guide rails 34*a* are fixedly mounted on a face side, i.e., a front surface, of the Y-axis movable plate 28*a* and extend along the Z-axis directions. A flat Z-axis movable plate 36*a* is slidably mounted on the Z-axis guide rails 34*a*. An unillustrated nut is mounted on a reverse side, i.e., a rear surface, of the Z-axis movable plate 36*a*. The nut is operatively threaded over a Z-axis ball screw 38*a* disposed between and extending generally parallel to the Z-axis guide rails 34*a*. The Z-axis ball screw 38*a* has an end coupled to a Z-axis stepping motor 40*a* for rotating the Z-axis ball screw 38*a* about its vertical central axis. When the Z-axis stepping motor 40*a* is energized, it rotates the Z-axis ball screw 38*a* about its vertical central axis, causing the nut to move the Z-axis movable plate 36*a* in one of the Z-axis directions along the Z-axis guide rails 34*a*.

Similarly, the moving mechanism 24*b* includes a flat Y-axis movable plate 28*b* slidably mounted on the Y-axis guide rails 26. An unillustrated nut is mounted on a reverse side, i.e., a rear surface, of the Y-axis movable plate 28*b*. The nut is operatively threaded over a Y-axis ball screw 30*b* disposed between and extending generally parallel to the Y-axis guide rails 26. The Y-axis ball screw 30*b* has an end coupled to an unillustrated Y-axis stepping motor for rotating the Y-axis ball screw 30*b* about its horizontal central axis. When the Y-axis stepping motor is energized, it rotates the Y-axis ball screw 30*b* about its horizontal central axis, causing the nut to move the Y-axis movable plate 28*b* in one of the Y-axis directions along the Y-axis guide rails 26. A pair of Z-axis guide rails 34*b* are fixedly mounted on a face side, i.e., a front surface, of the Y-axis movable plate 28*b* and extend along the Z-axis directions. A flat Z-axis movable plate 36*b* is slidably mounted on the Z-axis guide rails 34*b*. An unillustrated nut is mounted on a reverse side, i.e., a rear surface, of the Z-axis movable plate 36*b*. The nut is operatively threaded over a Z-axis ball screw 38*b* disposed between and extending generally parallel to the Z-axis guide rails 34*b*. The Z-axis ball screw 38*b* has an end coupled to a Z-axis stepping motor 40*b* for rotating the Z-axis ball screw 38*b* about its vertical central axis. When the Z-axis stepping motor 40*b* is energized, it rotates the Z-axis ball screw 38*b* about its vertical central axis, causing the nut to move the Z-axis movable plate 36*b* in one of the Z-axis directions along the Z-axis guide rails 34*b*.

The cutting unit 20*a* is fixed to a lower portion of the Z-axis movable plate 36*a*, whereas the cutting unit 20*b* is fixed to a lower portion of the Z-axis movable plate 36*b*. An image capturing unit 42 for capturing images of a subject such as a workpiece 11 held on the chuck table 10 is disposed in a position adjacent to the cutting units 20*a* and 20*b*. The image capturing unit 42 includes an image capturing device such as a charge-coupled device (CCD) image sensor or a complementary-metal-oxide-semiconductor (CMOS) image sensor and an optical system including an optical device such as an objective lens. The image capturing unit 42 may be of any of various types selected depending on the material or other properties of the workpiece 11. For example, the image capturing unit 42 may include a visible light camera or an infrared camera as the image capturing device. An image captured by the image capturing unit 42 will be used in a process for positioning the workpiece 11 with respect to the cutting units 20a and 20b.

The base 4 further has a circular opening 4c defined therein alongside the opening 4b and open upwardly in the upper surface of the base 4. The opening 4c accommodates therein a cleaning unit 44 for cleaning a workpiece 11. The cleaning unit 44 includes a spinner table 46 for holding and rotating the workpiece 11 and a nozzle 48 for supplying the workpiece 11 held on the spinner table 46 with a cleaning fluid. The spinner table 46 has an upper surface lying flatwise generally parallel to the horizontal plane, i.e., the XY plane. The upper surface of the spinner table 46 acts as a holding surface 46a for holding the workpiece 11 thereon. The holding surface 46a is fluidly connected to an unillustrated suction source such as an ejector through an unillustrated suction channel defined in the spinner table 46 and an unillustrated valve. The spinner table 46 is coupled to an unillustrated rotary actuator such as an electric motor for rotating the spinner table 46 about its vertical central axis generally parallel to the Z-axis. The nozzle 48 is disposed above the spinner table 46. The cleaning fluid supplied from the nozzle 48 is, for example, liquid such as pure water or a mixed fluid of liquid such as pure water and gas such as air. While the workpiece 11 is being held on the spinner table 46, the rotary actuator rotates the spinner table 46 about its vertical axis, and the nozzle 48 supplies the workpiece 11 with the cleaning fluid, thereby cleaning the workpiece 11.

An unillustrated delivery mechanism is disposed on the base 4 in the vicinity of the openings 4b and 4c for delivering a workpiece 11 between the chuck table 10 and the spinner table 46. After a workpiece 11 has been processed, i.e., cut, by the cutting units 20a and 20b, the workpiece 11 is delivered by the delivery mechanism from the chuck table 10 to the spinner table 46 where the workpiece 11 is cleaned. Then, the cleaned workpiece 11 is delivered by the delivery mechanism from the cleaning unit 44 to the cassette 8 where the workpiece 11 is stored.

A cover 50 that covers the components mounted on the base 4 is disposed on the base 4. In FIG. 1, the cover 50 has its contour indicated by the two-dot-and-dash lines.

The cutting apparatus 2 also includes a display unit, i.e., a display panel or a display device, 52 mounted on a side wall of the cover 50 for displaying various pieces of information regarding the cutting apparatus 2. Specifically, the display unit 52, which may include any of various displays, displays various items of information with respect to the processing of a workpiece 11, i.e., processing conditions, processing details, etc. For example, the display unit 52 is a touch-panel display. The display unit 52 in the form of a touch-panel display also functions as an input unit, i.e., an input panel or an input device, for entering information into the cutting apparatus 2, so that the operator can enter information into the cutting apparatus 2 by touching the display unit 52. In other words, the display unit 52 functions as a user interface.

A signaling unit, i.e., a signaler or a signaling device, 54 for giving information to the operator is mounted on an upper wall of the cover 50. The signaling unit 54, which may be an indicator lamp, i.e., a warning lamp, for example, is turned on or blinks to indicate an error to the operator in the event of a malfunction of the cutting apparatus 2. However, the signaling unit 54 is not limited to any particular kinds. The signaling unit 54 may alternatively be a speaker for giving information to the operator by way of sound or speech.

The cutting apparatus 2 further includes a controller, i.e., a control unit or a control device, 56 for controlling the cutting apparatus 2. The controller 56 is electrically connected to the components of the cutting apparatus 2, i.e., the cassette support table 6, the chuck table 10, the moving mechanism 12, the clamps 18, the cutting units 20a and 20b, the moving mechanisms 24a and 24b, the image capturing unit 42, the cleaning unit 44, the display unit 52, the signaling unit 54, etc. The controller 56 outputs control signals to the components of the cutting apparatus 2 to control operations of the components and operate the cutting apparatus 2. The controller 56 is a computer, for example, and includes a processor such as a central processing unit (CPU) for carrying out arithmetic and processing operations required to operate the cutting apparatus 2, and a memory such as a read only memory (ROM) and a random access memory (RAM) for storing various items of information, i.e., data, programs, etc., to be used to operate the cutting apparatus 2.

A pair of annular cutting blades 58 for cutting a workpiece 11 are mounted respectively on the cutting units 20a and 20b such that the cutting blades 58 on the cutting units 20a and 20b face each other. Each of the cutting units 20 and 20b cuts a workpiece 11 held under suction on the chuck table 10 by causing the cutting blade 58 to cut into the workpiece 11 while rotating the cutting blade 58 about its central axis. The cutting apparatus 2 may include one set of cutting units.

Figure 2A:
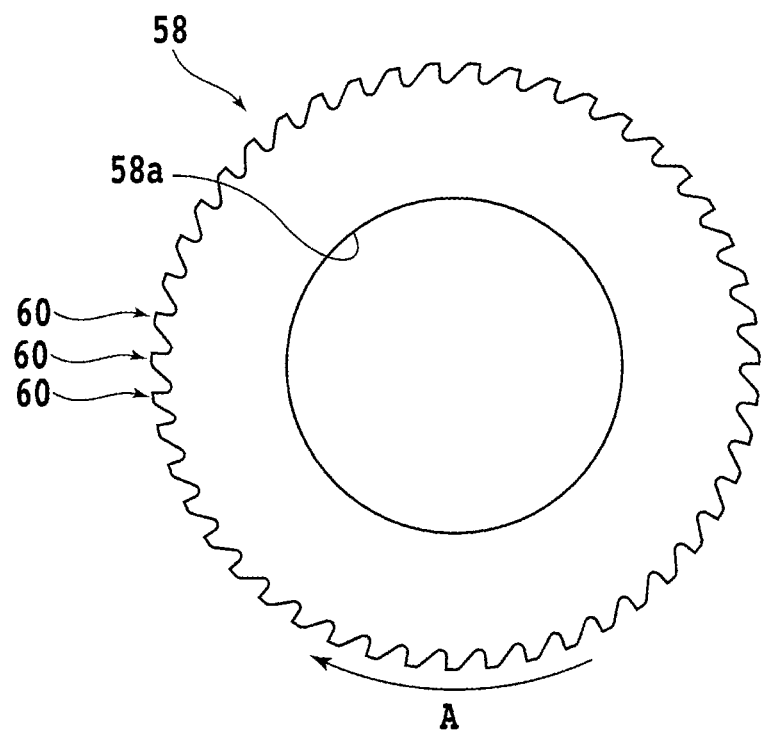
FIG. 2A is a front elevational view of a cutting blade of the cutting apparatus.

FIG. 2A illustrates one of the cutting blades 58 in plan. The cutting blade 58 that is annular in shape is made of a metal material such as hard metal alloy or stainless steel and contains no abrasive grains, for example. The cutting blade 58 may be a metal saw or a hard metal cutter. If the cutting blade 58 is a metal saw of hard metal alloy, then the hard metal alloy may contain appropriately selected metal materials. For example, the cutting blade 58 may be made of a composite material, i.e., an alloy, obtained by sintering a mixture of a carbide of metal such as tungsten, chromium, molybdenum, titanium, zirconium, hafnium, vanadium, niobium, or tantalum and a ferrous metal such as iron, cobalt, or nickel. In particular, a WC—Co alloy containing tungsten carbide (WC) and cobalt (Co) is suitable as the material of the cutting blade 58 because it exhibits high hardness in a wide temperature range and has excellent mechanical strength. However, there are no limitations on the material of the cutting blade 58. The cutting blade 58 may alternatively be, for example, an annular grindstone produced by abrasive grains of diamond, cubic boron nitride (cBN), or the like being bound with a binder of metal, ceramic, resin, or the like.

The cutting blade 58 has a circular opening 58a that is defined centrally therein and that extends thicknesswise through the cutting blade 58. The cutting blade 58 also has a plurality of saw-toothed protrusions, i.e., serrations or sawteeth, 60 on its outer circumferential edge that protrude radially outwardly. The protrusions 60 are generally identical in shape to each other and are arrayed at generally equal spaced intervals along the outer circumferential edge of the cutting blade 58.

Figure 2B:
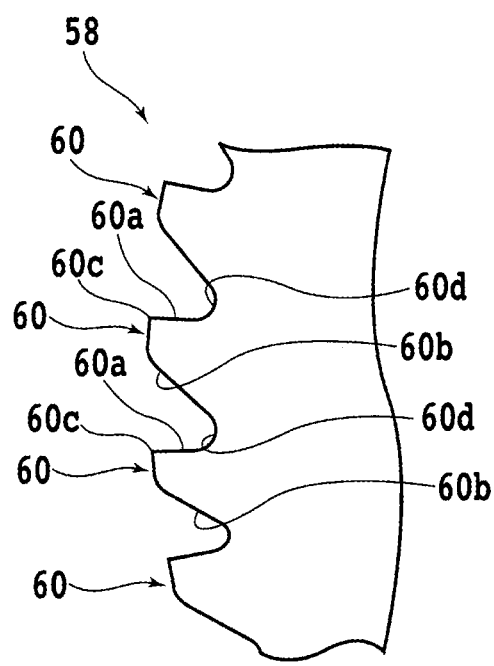
FIG. 2B is an enlarged fragmentary front elevational view of an outer circumferential portion of the cutting blade.

FIG. 2B illustrates an outer circumferential portion of the cutting blade 58 in enlarged fragmentary front elevation. As illustrated in FIG. 2B, each of the protrusions 60 includes a first surface, i.e., a rake surface, 60a and a second surface, i.e., a flank surface, 60b that lie generally parallel to the thicknesswise directions of the cutting blade 58. The first surface 60a and the second surface 60b are spaced from each other along the circumferential directions of the cutting blade 58, and have respective radially outer ends, i.e., tip ends, that are connected to each other and that jointly make up a tip end 60c of the protrusion 60. The first surface 60a and the second surface 60b have respective radially inner ends, i.e., base ends, providing bottoms, i.e., cutting edge bottoms, 60d of the protrusion 60 that are joined to bottoms 60d of other protrusions 60 adjacent thereto. The angle of tilt by which the first surface 60a is inclined with respect to a radial direction of the cutting blade 58 is smaller than the angle of tilt by which the second surface 60b is inclined with respect to the radial direction of the cutting blade 58. In other words, the protrusion 60 is shaped such that the first surface 60a is steeper than the second surface 60b. For example, the first surface 60a extends parallel to the radial direction of the cutting blade 58, i.e., the angle of tilt thereof=0°, whereas the second surface 60b is oblique to the radial direction of the cutting blade 58, i.e., the angle of tilt thereof >0°. The distance from the tip end of the first surface 60a to the base end thereof is smaller than the distance from the tip end of the second surface 60b to the base end thereof. The area of the first surface 60a is smaller than the area of the second surface 60b.

One of the cutting blades 58 is mounted on the cutting unit 20a (see FIG. 1) and rotatable in the direction indicated by the arrow A (see FIG. 2A). Stated otherwise, the cutting blade 58 is rotated about its central axis such that the first surface 60a of each of the protrusions 60 is positioned ahead of the second surface 60b thereof in the direction indicated by the arrow A. The cutting unit 20a cuts the workpiece 11 held on the chuck table 10 by causing the rotating cutting blade 58 to cut into the workpiece 11. Similarly, the other cutting blade 58 is mounted on the cutting unit 20b (see FIG. 1), which cuts the workpiece 11 with the cutting blade 58. When the rotating cutting blade 58 cuts into the workpiece 11, the first surfaces 60a of the protrusions 60 mainly contact the workpiece 11, scraping chips or swarf off from the workpieces 11. The chips or swarf produced from the workpiece 11 when the cutting blades 58 cut the workpiece 11 is forced by the first surfaces 60a to move forwardly in the direction indicated by the arrow A.

Structural details of the cutting units 20a and 20b will be described below by way of example. As the cutting units 20a and 20b are identical to each other, structural details of the cutting unit 20a will be described below.

Figure 3:
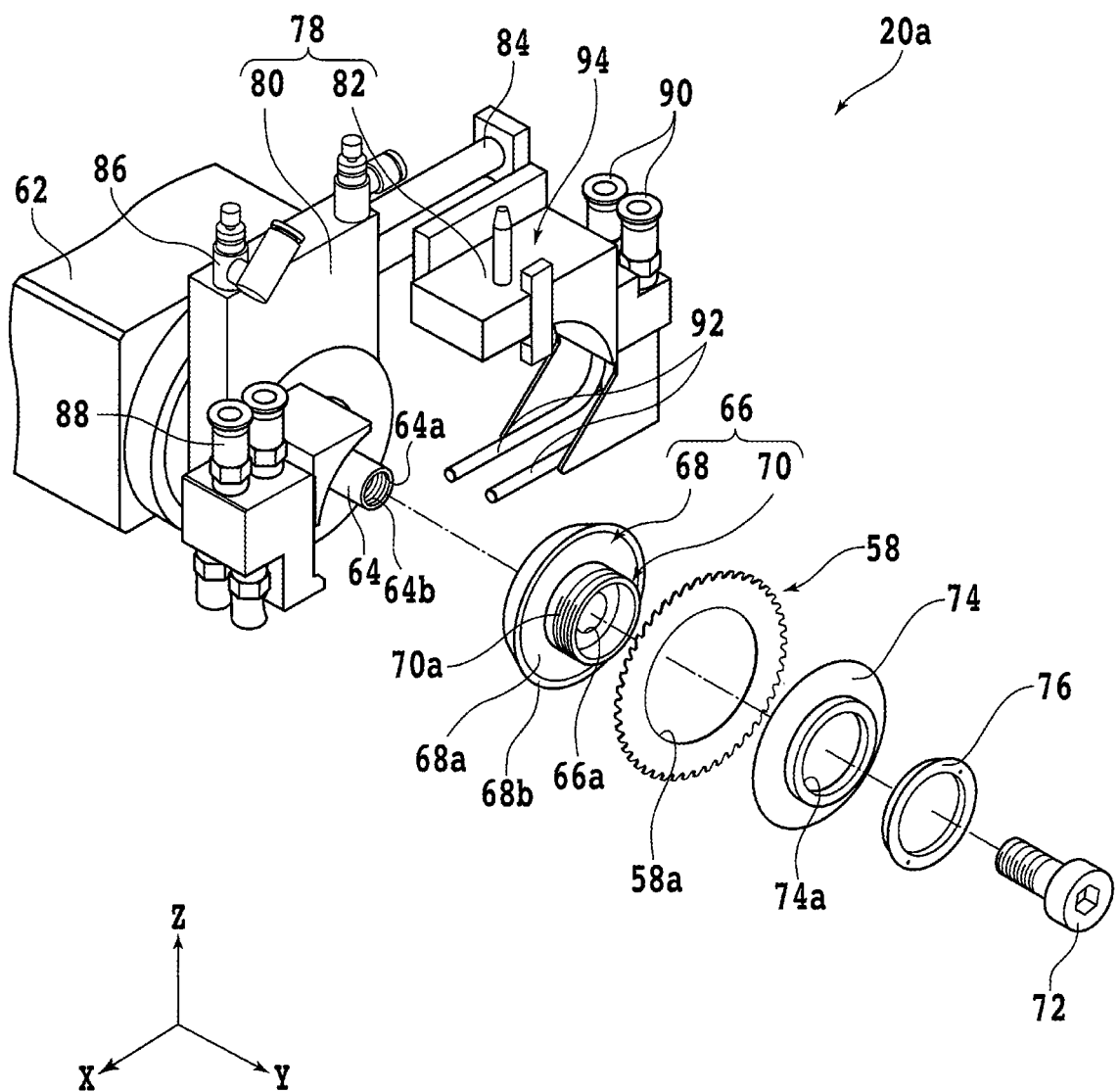
FIG. 3 is an enlarged exploded perspective view of a cutting unit of the cutting apparatus.

FIG. 3 illustrates the cutting unit 20a in enlarged exploded perspective. As illustrated in FIG. 3, the cutting unit 20a includes a columnar housing 62 coupled to the moving mechanism 24a (see FIG. 1). A cylindrical spindle 64 extending along the Y-axis is rotatably housed in the housing 62. The spindle 64 has an end portion, i.e., a distal end portion, exposed from the housing 62 and another end portion, i.e., a proximal end portion, connected to an unillustrated rotary actuator such as an electric motor. The distal end portion of the spindle 64 has an opening 64a defined axially therein by an internally threaded inner circumferential wall surface 64b.

A blade mount 66 is fixedly mounted on the distal end portion of the spindle 64. The blade mount 66 includes a disk-shaped flange 68 and a cylindrical boss, i.e., a support shaft, 70 protruding axially from a surface 68a of the flange 68. The blade mount 66 has an opening 66a that is defined therein and that extends axially centrally through the flange 68 and the boss 70. A fastening bolt 72 is inserted through the opening 66a in the blade mount 66 into the opening 64a in the spindle 64 in threaded engagement with the internally threaded inner circumferential wall surface 64b, thereby fastening the blade mount 66 to the distal end portion of the spindle 64.

An annular ridge 68b projects axially from the surface 68a of the flange 68 along an outer circumferential edge thereof. The ridge 68b has a flat distal end face generally parallel to the surface 68a and acting as a support surface supporting the cutting blade 58 thereon. The boss 70 has an externally threaded outer circumferential wall surface 70a.

The cutting blade 58 and an annular flange, i.e., a holder flange, 74 made of metal or the like are mounted on the blade mount 66. The flange 74 has a circular opening 74a that is defined centrally therein and that extends thicknesswise through the flange 74. When the boss 70 of the blade mount 66 is inserted successively through the opening 58a in the cutting blade 58 and the opening 74a in the flange 74, the cutting blade 58 and the flange 74 are supported on the blade mount 66. Then, an annular mounting nut 76 is brought into threaded engagement with the externally threaded outer circumferential wall surface 70a of the boss 70 and tightened, so that the cutting blade 58 and the flange 74 are fastened to the blade mount 66. As a result, the cutting blade 58 is gripped between the flange 68 and the flange 74 and fixedly mounted on the distal end portion of the spindle 64.

A blade cover 78 for covering the cutting blade 58 mounted on the distal end portion of the spindle 64, i.e., the blade mount 66, is mounted on the housing 62. The blade cover 78 includes a main body 80 fixed to a distal end portion of the housing 62 and a slide cover 82 slidable along the X-axis toward and away from the main body 80. The slide cover 82 is operatively coupled to the main body 80 by an air cylinder 84. When air is supplied to a joint 86 on the main body 80 that is connected to the air cylinder 84, the air actuates the air cylinder 84 to cause the slide cover 82 to slide along the X-axis away from the main body 80. The blade cover 78 is now opened, allowing the cutting blade 58 to be mounted on the distal end portion of the spindle 64. After the cutting blade 58 has been mounted on the spindle 64, the slide cover 82 is caused to slide along the X-axis toward the main body 80, closing the blade cover 78 into covering relation to the cutting blade 58.

A joint 88 for being supplied with liquid such as pure water, i.e., a cutting liquid, is disposed on the main body 80. The main body 80 has an unillustrated cutting liquid supply channel that is defined therein and that is connected to the joint 88. The cutting liquid supply channel has a distal end that is open toward the outer circumferential edge of the cutting blade 58. When the cutting liquid is supplied to the joint 88, the cutting fluid flows through the joint 88 into the cutting liquid supply channel, from which the cutting liquid is supplied to the outer circumferential portion of the cutting blade 58.

The slide cover 82 has a pair of joints 90 for being supplied with liquid such as pure water and a pair of nozzles 92 connected to the respective joints 90. The nozzles 92 are disposed in sandwiching relation to a lower portion of the cutting blade 58 that is mounted on the distal end portion of the spindle 64. The nozzles 92 have unillustrated cutting liquid supply ports defined in respective distal end portions thereof and open toward the cutting blade 58. When the cutting liquid is supplied to the joints 90, the cutting liquid flows through the joints 90 into the nozzles 92 and is ejected from the cutting liquid supply ports toward face and reverse sides of the cutting blade 58.

The cutting blade 58 mounted on the distal end portion of the spindle 64 is rotated about its central axis generally parallel to the Y-axis by rotary power generated by the rotary actuator connected to the spindle 64 and transmitted through the spindle 64 and the blade mount 66. The cutting blade 58 that is being rotated cuts into the workpiece 11 (see FIG. 1), cutting the workpiece 11. While the cutting blade 58 is cutting the workpiece 11, the workpiece 11 and the cutting blade 58 are supplied with the cutting liquid from the joints 88 and 90. The cutting liquid supplied to the workpiece 11 and the cutting blade 58 cools the workpiece 11 and the cutting blade 58 and washes away swarf produced from the workpiece 11 as it is cut by the cutting blade 58.

The blade cover 78 incorporates an image capturing unit 94 for capturing images of the cutting blade 58. The image capturing unit 94 captures images of the outer circumferential portion of the cutting blade 58 mounted on the cutting unit 20*a*, allowing the state of the outer circumferential portion of the cutting blade 58 to be monitored according to the captured images.

Figure 4:
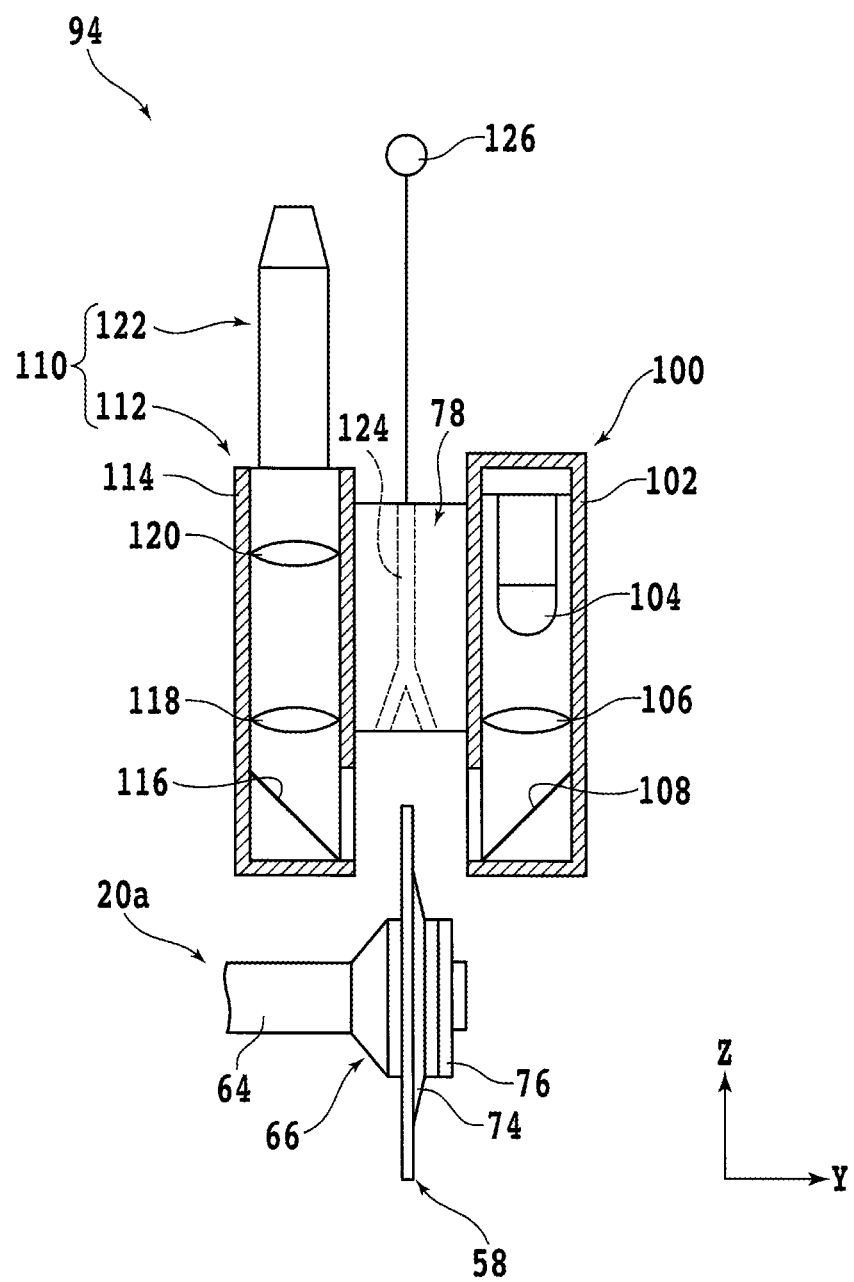
FIG. 4 is a front elevational view, partly in cross section, of an image capturing unit of the cutting apparatus.

FIG. 4 illustrates the image capturing unit 94 in front elevation, partly in cross section. As illustrated in FIG. 4, the image capturing unit 94 includes a light emitter 100 for emitting light and a light detector 110 for detecting light emitted from the light emitter 100. The light emitter 100 and the light detector 110 are disposed one on each side of an upper end portion of the cutting blade 58 mounted on the distal end portion of the spindle 64 and are spaced from each other across the upper end portion of the cutting blade 58 along the Y-axis.

The light emitter 100 includes a casing 102 in the form of a hollow rectangular parallelepiped. The casing 102 houses therein a light source 104 such as an LED, a condensing lens 106, and a mirror 108. Light emitted from the light source 104 is applied to the condensing lens 106 that is disposed below the light source 104. The light that has passed through the condensing lens 106 is focused and reflected by a surface of the mirror 108 disposed below the condensing lens 106 toward the light detector 110. The light reflected from the mirror 108, i.e., emitted from the light emitter 100, travels along a direction generally parallel to the Y-axis to reach the light detector 110.

The light detector 110 includes a microscope 112 for magnifying an image created by the light emitted from the light emitter 100 and applied to the light detector 110 and a camera 122 for capturing the image magnified by the microscope 112. The microscope 112 includes a casing 114 in the form of a hollow rectangular parallelepiped. The casing 114 houses therein a mirror 116 and a pair of convex lenses 118 and 120. The light from the light emitter 100 is introduced into the light detector 110 in which the light is reflected by a surface of the mirror 116 and then travels successively through the convex lenses 118 and 120. The light that has passed through the convex lens 120 is applied to the camera 122. The camera 122 includes an image capturing device such as a CCD image sensor or a CMOS image sensor for converting the light from the microscope 112 into an electric signal. The image capturing device captures an image represented by the electric signal converted from the light.

The blade cover 78 has a gas supply channel 124 defined therein. The gas supply channel 124 has a lower end that is open toward the upper end portion of the cutting blade 58 and an upper end connected to a gas supply source 126. Gas such as air that is supplied from the gas supply source 126 to the gas supply channel 124 is ejected from the gas supply channel 124 toward the upper end portion of the cutting blade 58, thereby removing foreign matter such as swarf and cutting liquid deposited on the cutting blade 58.

With the cutting blade 58 mounted on the distal end portion of the spindle 64, when the light source 104 is energized to emit light, the light travels from the light emitter 100 toward the light detector 110. At this time, part of the light from the light emitter 100 is blocked by the outer circumferential portion, i.e., the upper end portion, of the cutting blade 58 and does not reach the light detector 110. When the camera 122 captures the light that has reached the light detector 110 and passed through the microscope 112, the image capturing unit 94 acquires a magnified image of the outer circumferential portion of the cutting blade 58. For example, the image capturing unit 94 acquires a magnified image of the outer circumferential portion of the cutting blade 58 before or after the cutting blade 58 processes the workpiece 11 or while the cutting blade 58 is processing the workpiece 11. The magnified image acquired by the image capturing unit 94 is used to check the extent to which the cutting blade 58 has been worn, whether there are chips or cracks in the outer circumferential portion of the cutting blade 58, and other flaws or defects, thereby monitoring the state of the cutting blade 58. Before the image capturing unit 94 captures an image of the cutting blade 58, gas is ejected from the gas supply channel 124 to the cutting blade 58 to blow away foreign matter deposited on the cutting blade 58, so that such foreign matter is prevented from being included in the image of the cutting blade 58 captured by the image capturing unit 94.

Figure 5A:
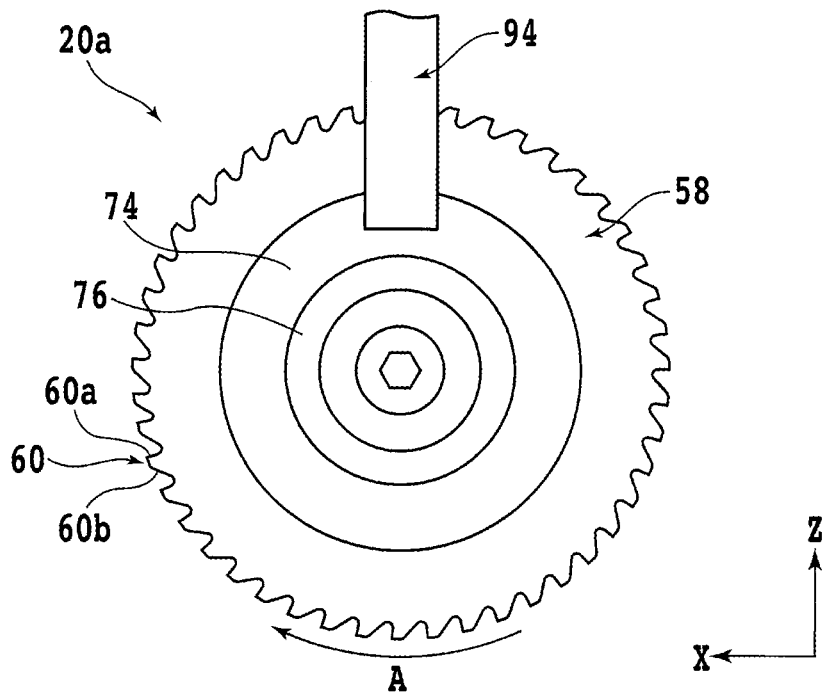
FIG. 5A is a side elevational view of a first cutting unit.
Figure 5B:
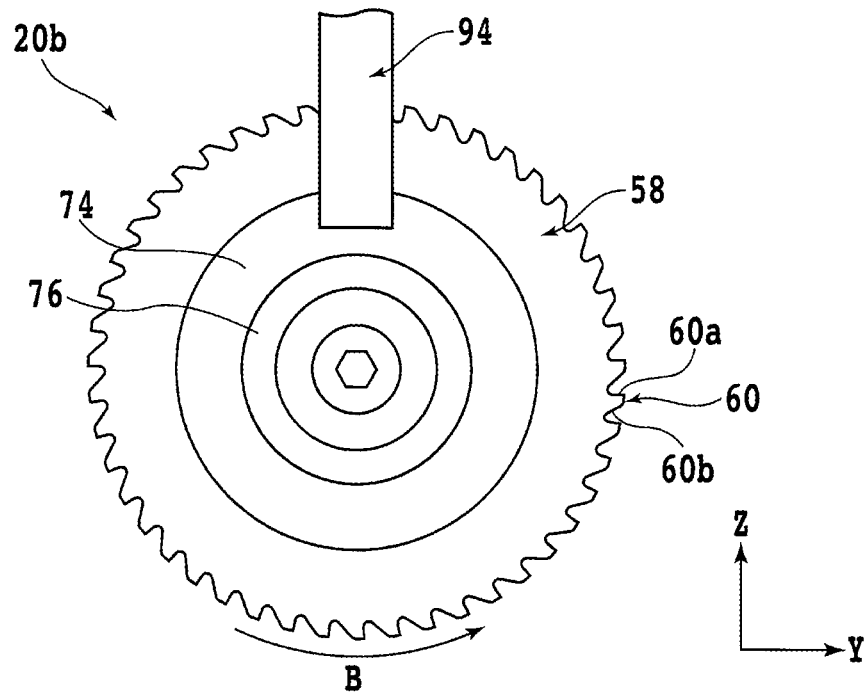
FIG. 5B is a side elevational view of a second cutting unit.

FIG. 5A illustrates the cutting unit 20*a* in side elevation, and FIG. 5B illustrates the cutting unit 20*b* in side elevation. Respective cutting blades 58 are mounted on the cutting units 20*a* and 20*b*, and the cutting units 20*a* and 20*b* are disposed such that the cutting blades 58 mounted thereon face each other along the Y-axis (see FIG. 1). Respective image capturing units 94 are mounted on the cutting units 20*a* and 20*b* for capturing respective images of the outer circumferential portions, i.e., the upper end portions, of the cutting blades 58.

When the cutting apparatus 2 is in operation, the cutting blades 58 mounted on the cutting units 20*a* and 20*b* and the spindles 64 of the cutting units 20*a* and 20*b* are rotated in respective directions that are opposite to each other as the cutting blades 58 are viewed from the mounting nuts 76. For example, the cutting blade 58 mounted on the cutting unit 20*a* is rotated clockwise as indicated by the arrow A in FIG. 5A, whereas the cutting blade 58 mounted on the cutting unit 20*b* is rotated counterclockwise as indicated by the arrow B in FIG. 5B. As described above, the cutting blades 58 are mounted on the respective cutting units 20*a* and 20*b* such that the first surface 60*a* of each protrusion 60 is positioned forwardly of the second surface 60*b* thereof in the direction of rotation of the cutting blade 58. Hence, as illustrated in FIGS. 5A and 5B, the cutting blades 58 are mounted on the respective cutting units 20*a* and 20*b* in opposite orientations, i.e., their protrusions 60 are directed in opposite orientations. When the operator is to install the cutting blades 58 on the respective cutting units 20*a* and 20*b*, the operator is required to visually recognize the orientation of the minute protrusions 60 and mount the cutting blades 58 in predetermined orientations taking into account the direction in which the chuck table 10 will be processing-fed with respect to the cutting units 20*a* and 20*b* to cut the workpiece 11. In view of these requirements, the operator is likely to install the cutting blades 58 in wrong orientations. Particularly, providing the cutting blades 58 are to be mounted on the respective cutting units 20*a* and 20*b* in different orientations, as illustrated in FIGS. 5A and 5B, the operator is liable to misunderstand the proper orientations of the cutting blades 58 and is more likely to mount the cutting blades 58 in erroneous orientations. If the cutting blades 58 installed in the wrong orientations are used to cut the workpiece 11 continuously, then the workpiece 11 is not cut as intended by the operator, possibly causing processing failures.

According to the present embodiment, the image capturing unit 94 captures images of the outer circumferential portions of the cutting blades 58 mounted on the cutting units 20a and 20b, and the orientations of the cutting blades 58 are determined according to the images captured of the cutting blades 58 by the image capturing unit 94. Thus, the cutting blades 58 are prevented from continuing to cut the workpiece 11 while being mounted in wrong orientations.

Figure 6:
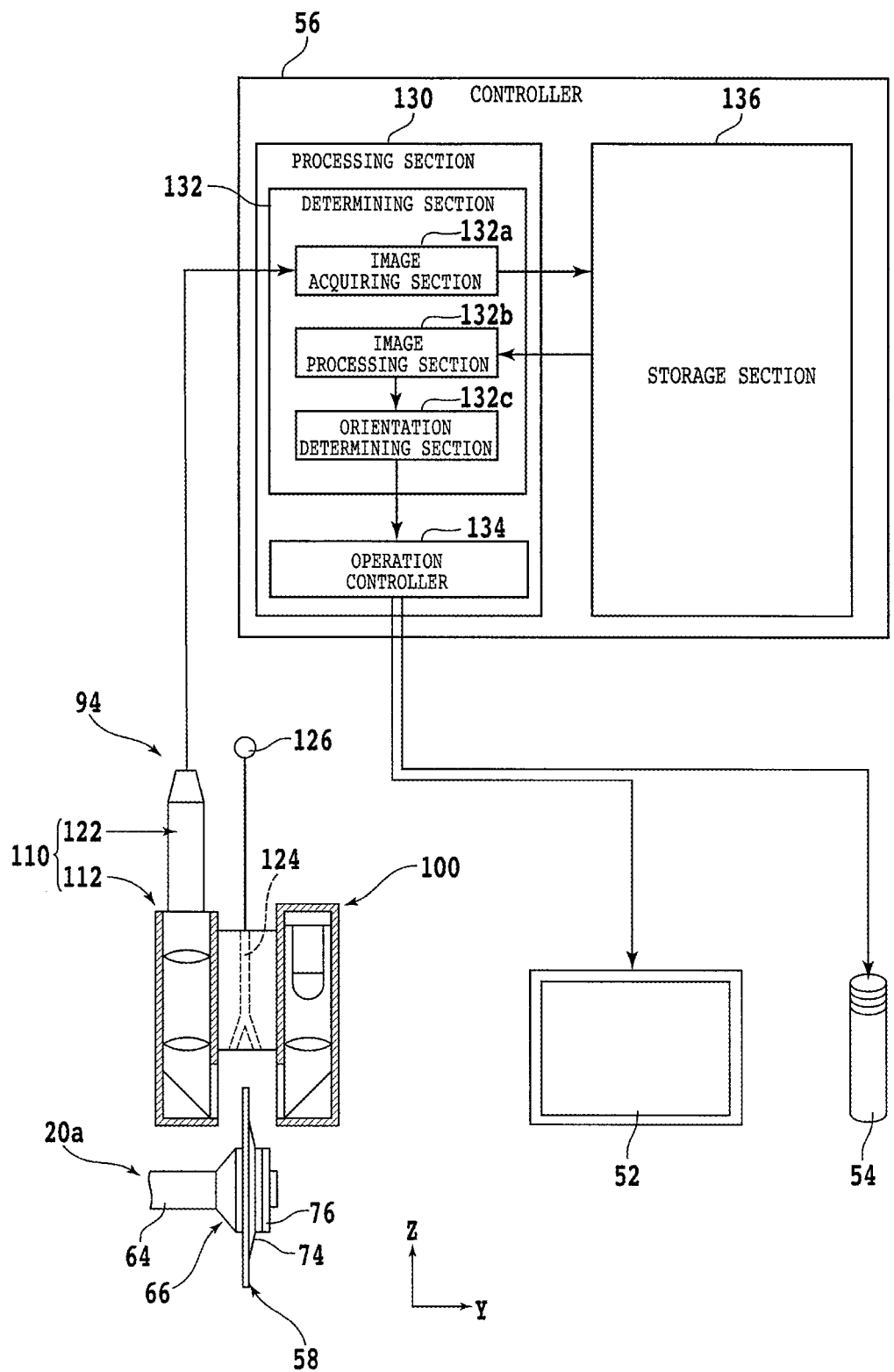
FIG. 6 is a block diagram of a controller of the cutting apparatus.

The determination of the orientations of the cutting blades 58 is controlled by the controller 56 (see FIG. 1) of the cutting apparatus 2. FIG. 6 illustrates the controller 56 in block form. FIG. 6 illustrates in addition to functional blocks of the controller 56 some components of the cutting apparatus 2, i.e., the cutting unit 20a, the display unit 52, the signaling unit 54, and the image capturing unit 94. A process of determining the orientation of the cutting blade 58 mounted on the cutting unit 20a will be described below. However, the same process is also applicable to the determination of the orientation of the cutting blade 58 mounted on the cutting unit 20b.

As illustrated in FIG. 6, the controller 56 includes a processing section 130 for performing processes required to operate the cutting apparatus 2 and a storage section 136 for storing information such as data and programs used in the processes performed by the processing section 130. The processing section 130 includes a determining section 132 for determining the orientations of the cutting blade 58 mounted on the cutting unit 20a and an operation controller 134 for controlling the operation of the components of the cutting apparatus 2 according to the orientations determined by the determining section 132.

Figure 7A:
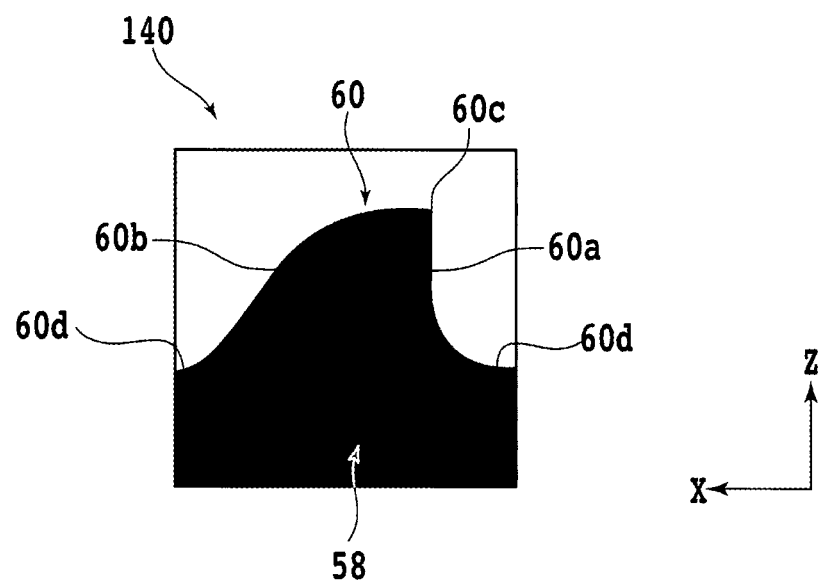
FIG. 7A is a diagram illustrating a captured image.

The determining section 132 is electrically connected to the camera 122 of the image capturing unit 94. The determining section 132 includes an image acquiring section 132a for acquiring an image of the outer circumferential portion, i.e., the upper end portion, of the cutting blade 58. The image capturing unit 94 captures an image of the outer circumferential portion of the cutting blade 58 mounted on the cutting unit 20a. The image captured of the outer circumferential portion of the cutting blade 58 by the image capturing unit 94 is input to the image acquiring section 132a. FIG. 7A illustrates the captured image, denoted by 140. The captured image 140 includes an image representing a protrusion 60 of the cutting blade 58. The captured image 140 has leftward and rightward directions corresponding to the X-axis directions; and upward and downward directions corresponding to the Z-axis directions. When the captured image 140 has been input from the image capturing unit 94 to the image acquiring section 132a, the image acquiring section 132a stores the captured image 140 in the storage section 136.

Figure 7B:
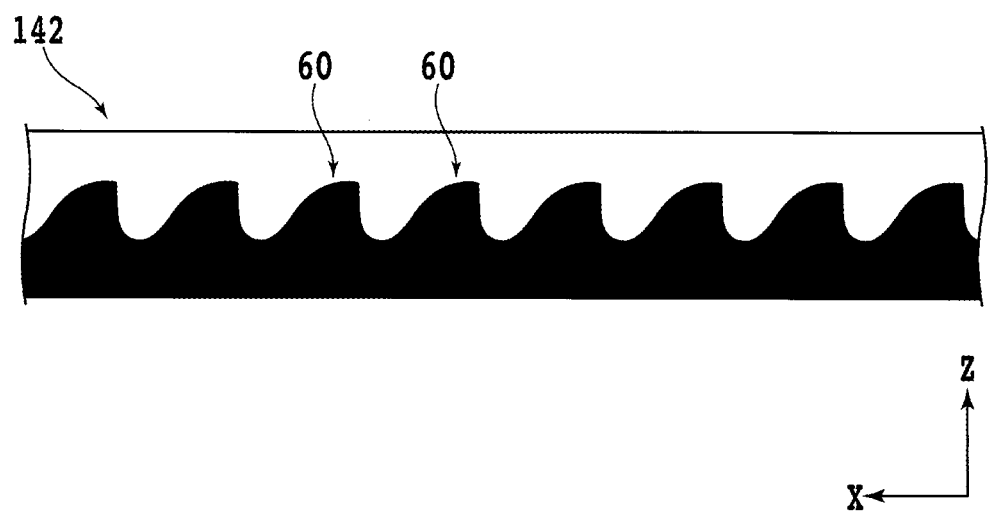
FIG. 7B is a diagram illustrating a combined image.

The image capturing unit 94 may capture a plurality of images of the outer circumferential portion of the cutting blade 58 while the cutting blade 58 is being rotated about its central axis, so that the image acquiring section 132a can acquire a plurality of captured images 140. For example, the image capturing unit 94 captures a succession of images of the outer circumferential portion of the cutting blade 58 until the cutting blade 58 makes one revolution. The images captured by the image capturing unit 94 are input as captured images 140 to the image acquiring section 132a, which acquires the input captured images 140. FIG. 7B illustrates a combined image 142 produced by combining the acquired plurality of captured images 140. When the image capturing unit 94 has captured a plurality of images 140, the image acquiring section 132a may join the images 140 together to generate the combined image 142 representing the entire outer circumferential portion of the cutting blade 58. The combined image 142 includes respective images of the protrusions 60 of the cutting blade 58. The image acquiring section 132a then stores the combined image 142 in the storage section 136.

The determining section 132 also includes an image processing section 132b for performing an image processing sequence on the captured image 140 or the combined image 142. The image processing section 132b performs an image processing sequence on the captured image 140 or the combined image 142 that is stored in the storage section 136, to extract information required for determination of the orientation of the cutting blade 58 mounted on the cutting unit 20a from the captured image 140 or the combined image 142. Specific examples of the image processing sequence performed by the image processing section 132b will be described later.

The determining section 132 further includes an orientation determining section 132c for determining the orientation of the cutting blade 58 according to the result of the image processing sequence. The orientation determining section 132c determines whether the cutting blade 58 is in a properly mounted state or an improperly mounted state on the cutting unit 20a in reference to information output from the image processing section 132b. The properly mounted state refers to a state in which the cutting blade 58 is mounted on the cutting unit 20a such that the first surface 60a of the protrusion 60 is positioned forwardly of the second surface 60b thereof in the direction of rotation of the cutting blade 58 (see FIGS. 5A and 5B). On the other hand, the improperly mounted state refers to a state in which the cutting blade 58 is mounted on the cutting unit 20a such that the first surface 60a of the protrusion 60 is positioned rearwardly of the second surface 60b thereof in the direction of rotation of the cutting blade 58.

The orientation determining section 132c outputs a signal indicating that the cutting blade 58 is in the properly mounted state, i.e., a properly mounted signal, or a signal indicating that the cutting blade 58 is in the improperly mounted state, i.e., an improperly mounted signal, as a determination result to the operation controller 134. In response to the determination result from the orientation determining section 132c, i.e., the determining section 132, the operation controller 134 controls operations of the components of the cutting apparatus 2.

Specifically, if the orientation determining section 132c inputs the properly mounted signal to the operation controller 134, then the operation controller 134 outputs control signals to the components of the cutting apparatus 2 to enable the cutting apparatus 2 to have the cutting blade 58 cut the workpiece 11. The workpiece 11 is now cut by the cutting blade 58 that has properly been mounted on the cutting unit 20a. If the orientation determining section 132c inputs the improperly mounted signal to the operation controller 134, then the operation controller 134 outputs control signals to the components of the cutting apparatus 2 to temporarily stop the cutting apparatus 2 from cutting the workpiece 11. The operation controller 134 also outputs control signals to the display unit 52 and the signaling unit 54 to issue a warning prompting the operator to be aware that the cutting blade 58 is mounted in a wrong orientation. For example, the operation controller 134 controls the display unit 52 to display a message indicating that the cutting blade 58 is mounted in a wrong orientation and also controls the signaling unit 54 to turn on or blink.

A process of determining the orientation in which the cutting blade 58 is mounted on the cutting unit 20a with use of the cutting apparatus 2 will be described below with reference to FIGS. 6 through 9. By way of example, a process in which the determining section 132 determines the orientation of the cutting blade 58 according to dimensions of the first surface 60a and the second surface 60b (see FIG. 2B) will be described in detail below.

First, the image capturing unit 94 performs an image capturing process to capture an image of the outer circumferential portion of the cutting blade 58, thereby acquiring a captured image 140 (see FIG. 7A). For example, the image capturing unit 94 captures a plurality of images of the outer circumferential portion of the cutting blade 58 while the cutting blade 58 is being rotated about its central axis, so that the image acquiring section 132a can acquire a plurality of captured images 140. The captured images 140 are then input to the image acquiring section 132a. The image acquiring section 132a then combines the captured images 140 into a combined image 142 (see FIG. 7B) including respective images of the protrusions 60 of the cutting blade 58. The combined image 142 is then stored in the storage section 136.

Figure 8A:
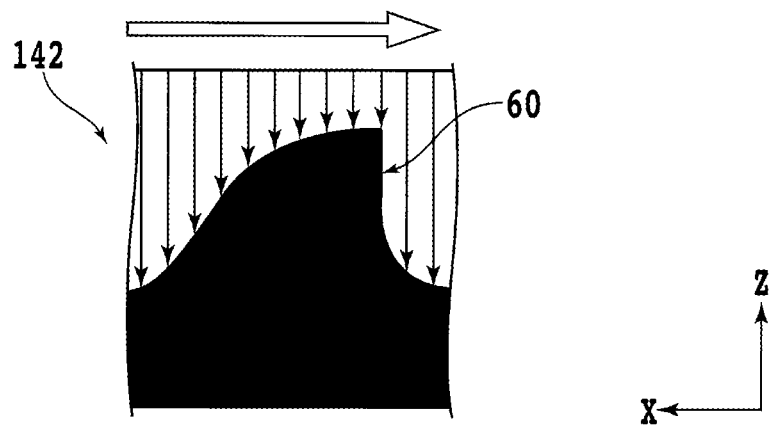
FIG. 8A is a diagram illustrating a portion of the combined image on which a cutting edge position detecting process is to be performed.

Then, the image processing section 132b performs a cutting edge position detecting process for detecting the position of a tip end, i.e., a cutting edge, of the cutting blade 58. FIG. 8A illustrates a portion of the combined image 142 on which the cutting edge position detecting process is to be performed.

In the cutting edge position detecting process, the image processing section 132b reads the combined image 142 from the storage section 136, and then performs a binarizing process on the combined image 142. The binarizing process is performed to make the contour of the cutting blade 58 represented by the combined image 142 recognizable more clearly. However, the binarizing process may be omitted if the combined image 142 represents the cutting blade 58 in a sufficiently sharp contrast.

Next, the image processing section 132b detects the gradations of pixels of a column at the left end of the combined image 142, i.e., pixels of a first column, successively downwardly, i.e., in a −Z-axis direction, and determines whether each of the pixels is displayed in white or black. Then, the image processing section 132b records the coordinate of a spot where the display of pixels of the combined image 142 changes from white to black as the coordinate of a tip end position of the cutting blade 58. Thereafter, the above detecting and determining cycle is repeated on the pixels of second and following columns. In this manner, the image processing section 132b acquires a collection of coordinates representing tip end positions of the cutting blade 58.

Figure 8B:
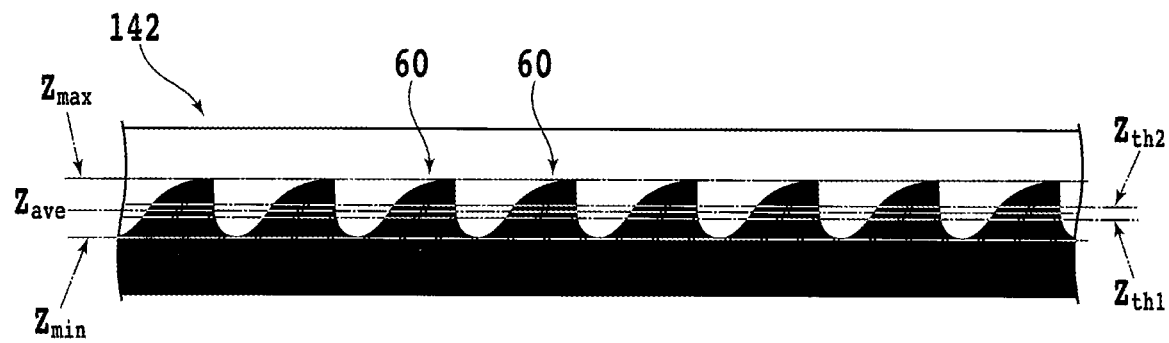
FIG. 8B is a diagram illustrating a portion of the combined image on which a detection range setting process is to be performed.

Then, the image processing section 132b performs a detection range setting process for setting a range in which dimensions of the cutting blade 58 are to be detected in the combined image 142. FIG. 8B illustrates a portion of the combined image 142 on which the detection range setting process is to be performed.

For example, the image processing section 132b specifies a minimum value $Z_{min}$ and a maximum value $Z_{max}$ of Z coordinates by referring to the coordinates of the tip end positions of the cutting blade 58 acquired in the cutting edge position detecting process. Then, the image processing section 132b sets a range of Z coordinates from the minimum value $Z_{min}$ to the maximum value $Z_{max}$ in the combined image 142 as a detection range to be used for detecting dimensions of the cutting blade 58. The detection range covers the images of the protrusions 60. Moreover, the image processing section 132b sets threshold values to be used in an extreme value specifying process described below. For example, the image processing section 132b calculates an average value $Z_{ave}$ of the minimum value $Z_{min}$ and the maximum value $Z_{max}$ and sets a predetermined value between the minimum value $Z_{min}$ and the average value $Z_{ave}$ as a first threshold value $Z_{th1}$ and a predetermined value between the maximum value $Z_{max}$ and the average value $Z_{ave}$ as a second threshold value $Z_{th2}$.

Figure 8C:
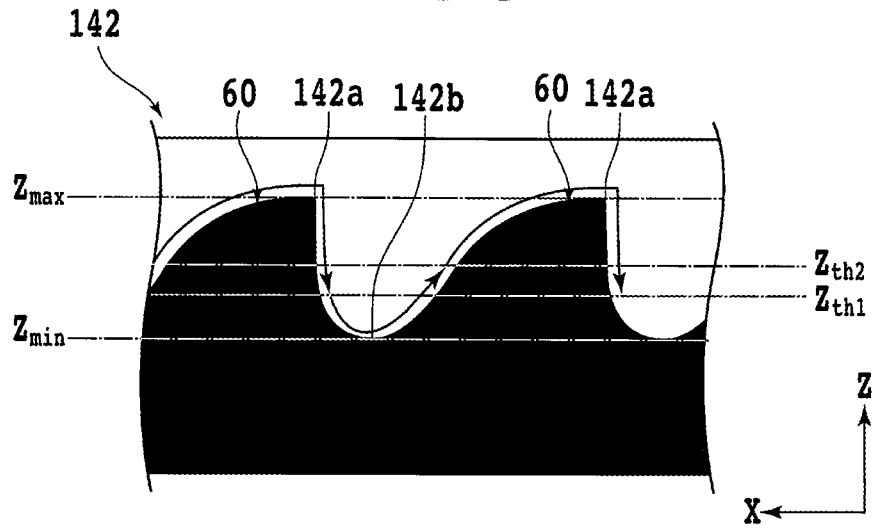
FIG. 8C is a diagram illustrating a portion of the combined image on which an extreme value specifying process is to be performed.

Then, the image processing section 132b performs an extreme value specifying process for specifying a maximum value and a minimum value of the coordinates of the tip end positions of the cutting blade 58. FIG. 8C illustrates a portion of the combined image 142 on which the extreme value specifying process is to be performed.

For example, the image processing section 132b reads the Z coordinates of the tip end positions of the cutting blade 58 successively rightwardly, i.e., in a −X-axis direction. At this time, the image processing section 132b reads the Z coordinates of the tip end positions of the cutting blade 58 while switching between a mode for detecting a maximum value of the Z coordinates, i.e., a maximum value detecting mode, and a mode for detecting a minimum value of the Z coordinates, i.e., a minimum value detecting mode.

Specifically, the image processing section 132b reads Z coordinates of the tip end positions of the cutting blade 58 successively in the −X-axis direction in the maximum value detecting mode. When the Z coordinates of the tip end positions of the cutting blade 58 become equal to or smaller than the first threshold value $Z_{th1}$, the maximum value detecting mode switches to the minimum value detecting mode, and the image processing section 132b specifies a maximum value of the Z coordinates that have been read in the maximum value detecting mode. Then, the image processing section 132b records the coordinate of a spot where the maximum value occurs, i.e., a maximum spot 142a, as the coordinate of the tip ends 60c (see FIG. 2B) of the protrusions 60 of the cutting blade 58. Next, the image processing section 132b reads the Z coordinates of the tip end positions of the cutting blade 58 successively in the −X-axis direction in the minimum value detecting mode. When the Z coordinates of the tip end positions of the cutting blade 58 become equal to or larger than the second threshold value $Z_{th2}$, the minimum value detecting mode switches to the maximum value detecting mode, and the image processing section 132b specifies a minimum value of the Z coordinates that have been read in the minimum value detecting mode. Then, the image processing section 132b records the Z coordinate of a spot where the minimum value occurs, i.e., a minimum spot 142b, as the Z coordinate of the bottoms 60d (see FIG. 2B) of the protrusions 60 of the cutting blade 58. The image processing section 132b repeats the above process to specify the coordinates of a plurality of maximum spots 142a and a plurality of minimum spots 142b included in the combined image 142.

Although the two threshold values, i.e., the first threshold value $Z_{th1}$ and the second threshold value $Z_{th2}$, are used to define a timing at which switching is to be made between the maximum value detecting mode and the minimum value detecting mode in the detection range setting process and the extreme value specifying process described above, a single threshold value may be used to define such a timing. For example, a threshold value $Z_{ave}$ (see FIG. 8B) that represents an average value of the first threshold value $Z_{th1}$ and the second threshold value $Z_{th2}$ may be used. However, when the captured images 140 (see FIG. 7A) are combined into the combined image 142, the image of the cutting blade 58 may possibly become discontinuous at junctions between the captured images 140, resulting in slight steps or discontinuities in the combined image 142 that may not be present in the cutting blade 58 in reality. Providing the single threshold value $Z_{ave}$ is used and the Z coordinate of such a step or discontinuity overlaps the threshold value $Z_{ave}$, the maximum value detecting mode may possibly switch to the minimum value detecting mode or the minimum value detecting mode may possibly switch to the maximum value detecting mode in error at the step or discontinuity, so that upper and lower ends of the step or discontinuity may be detected in error respectively as a maximum spot 142a and a minimum spot 142b. In contrast, when the two threshold values, i.e., the first threshold value $Z_{th1}$ and the second threshold value $Z_{th2}$, are used and the difference between them is adjusted such that the step or discontinuity will not overlap both the threshold values $Z_{th1}$ and $Z_{th2}$, extreme values are prevented from being detected in error at steps or discontinuities.

Figure 9:
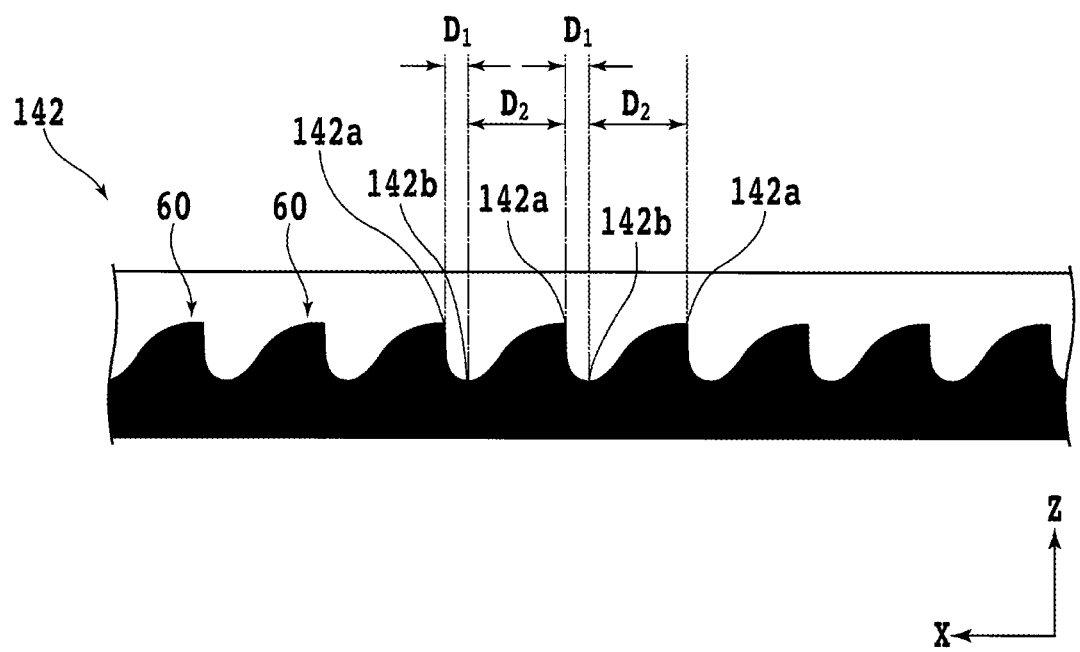
FIG. 9 is a diagram illustrating a portion of the combined image on which a dimension calculating process is to be performed.

Next, the image processing section 132b performs a dimension calculating process for calculating dimensions of the first surface 60a and the second surface 60b (see FIG. 2B) according to the coordinates of the maximum spot 142a and the minimum spot 142b. For example, the image processing section 132b calculates a value commensurate with the distance between the tip end 60c and the bottom 60d (see FIG. 2B) of the protrusion 60 of the cutting blade 58. FIG. 9 illustrates a portion of the combined image 142 on which the dimension calculating process is to be performed.

First, the image processing section 132b calculates a distance $D_1$ along the X-axis between a predetermined maximum spot 142a and a minimum spot 142b that is positioned adjacent to the maximum spot 142a on its right side. Next, the image processing section 132b calculates a distance $D_2$ along the X-axis between the minimum spot 142b that has been used to calculate the distance $D_1$ and a maximum spot 142a that is positioned adjacent to the minimum spot 142b on its right side. Further, the image processing section 132b calculates a distance $D_1$ along the X-axis between the maximum spot 142a that has been used to calculate the distance $D_2$ and a minimum spot 142b that is positioned adjacent to the maximum spot 142a on its right side. The image processing section 132b repeats the above processing cycle with respect to all the maximum spots 142a and the minimum spots 142b, thereby calculating a plurality of distances $D_1$ and a plurality of distances $D_2$ in the combined image 142. The image processing section 132b then calculates an average value of the distances $D_1$ and an average value of the distances $D_2$, and outputs the calculated average values to the orientation determining section 132c. Alternatively, the image processing section 132b may output a total value of the distances $D_1$ and a total value of the distances $D_2$ to the orientation determining section 132c.

The orientation determining section 132c performs an orientation specifying process for specifying the orientation of the cutting blade 58 mounted on the cutting unit 20a, according to the values input from the image processing section 132b. For example, the orientation determining section 132c compares the average value or the total value of the distances $D_1$ and the average value or the total value of the distances $D_2$ with each other, and determines the orientation of the cutting blade 58 according to the relation of the magnitudes of the compared values.

Specifically, when the cutting blade 58 is mounted on the cutting unit 20a such that the first surface 60a of each protrusion 60 is positioned forwardly of the second surface 60b thereof in the direction of rotation of the cutting blade 58 (see FIG. 5A), the image acquiring section 132a generates the combined image 142 illustrated in FIG. 9. In the combined image 142, the average value of the distances $D_1$ from the maximum spots 142a to the minimum spots 142b is smaller than the average value of the distances $D_2$ from the minimum spots 142b to the maximum spots 142a. In this case, the orientation determining section 132c determines that the cutting blade 58 is properly mounted on the cutting unit 20a, i.e., in the properly mounted state, and outputs a properly mounted signal to the operation controller 134.

On the other hand, when the cutting blade 58 is erroneously mounted on the cutting unit 20a such that the first surface 60a of each protrusion 60 is positioned rearwardly of the second surface 60b thereof in the direction of rotation of the cutting blade 58, the image acquiring section 132a generates a combined image that is a horizontal reversal of the combined image 142 illustrated in FIG. 9. In the reversal of the combined image 142, the average value of the distances $D_1$ from the maximum spots 142a to the minimum spots 142b is larger than the average value of the distances $D_2$ from the minimum spots 142b to the maximum spots 142a. In this case, the orientation determining section 132c determines that the cutting blade 58 is improperly mounted on the cutting unit 20a, i.e., in the improperly mounted state, and outputs an improperly mounted signal to the operation controller 134.

For example, the storage section 136 stores in advance reference information representing the relation between the dimensions of the protrusions 60 and a state of the cutting blade 58, i.e., the properly mounted state or the improperly mounted state. The orientation determining section 132c determines whether the cutting blade 58 is in the properly mounted state or the improperly mounted state according to dimensional values input from the image processing section 132b and the reference information.

As described above, the image processing section 132b calculates values corresponding to the dimensions of the protrusions 60 of the cutting blade 58 whose image has been captured by the image capturing unit 94. The orientation determining section 132c determines the orientation of the cutting blade 58 according to dimensional values calculated by the image processing section 132b. Values calculated by the image processing section 132b are not limited to the average value or the total value of the distances $D_1$ and the average value or the total value of the distances $D_2$, and may be other values. For example, the image processing section 132b may calculate straight distances from the maximum spots 142a to the minimum spots 142b and straight distances from the minimum spots 142b to the maximum spots 142a and output the calculated straight distances to the orientation determining section 132c.

The determining processes carried out by the determining section 132 are performed when programs stored in the storage section 136 including the memories are executed by the determining section 132. Specifically, the storage section 136 stores programs that are descriptive of the processes to be carried out by the image capturing unit 94 and the determining section 132. The controller 56 reads the programs from the storage section 136 and executes the programs, thereby automatically determining the orientation of the cutting blade 58.

As described above, the cutting apparatus 2 according to the present embodiment is capable of determining the orientation of the cutting blade 58 mounted on the cutting unit 20a, according to the images captured of the protrusions 60 of the cutting blade 58 by the image capturing unit 94. The workpiece 11 is prevented from being continuously cut by the cutting blade 58 that is mounted in a wrong orientation on the cutting unit 20*a*, thereby preventing processing failures from occurring due to the cutting blade 58 installed in the wrong orientation.

In the above embodiment, the determining section 132 determines the orientation of the cutting blade 58 according to the dimensions of the protrusions 60 of the cutting blade 58 by way of example. However, the present invention is not limited to the above process of determining the orientation of the cutting blade 58. For example, the determining section 132 may determine the orientation of the cutting blade 58 according to inclinations of the first surfaces 60*a* and the second surfaces 60*b* of the protrusions 60. Such another process of determining the orientation of the cutting blade 58 will be described below with reference to FIGS. 6 and 10A through 10C.

Figure 10A:
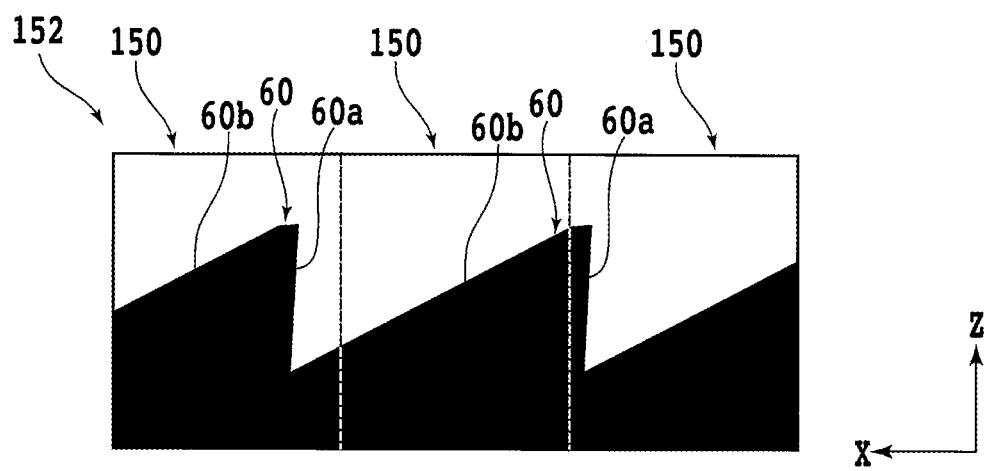
FIG. 10A is a diagram illustrating a combined image.

First, the image capturing unit 94 successively captures a plurality of images of the outer circumferential portion of the cutting blade 58, acquiring a plurality of captured images according to the process described above. The image acquiring section 132*a* joins the captured images to generate a combined image, and stores the combined image in the storage section 136. FIG. 10A illustrates the combined image, denoted by 152, produced by the acquired plurality of captured images, denoted by 150, being combined. In FIG. 10A, the combined image 152 represents the protrusions 60 of the cutting blade 58, each protrusion 60 having a first surface 60*a* and a second surface 60*b* that are essentially straight as viewed in front elevation.

Next, the image processing section 132*b* reads the combined image 152 from the storage section 136, and performs a binarizing process on the combined image 152. The binarizing process may be omitted if the combined image 152 represents the cutting blade 58 in a sufficiently sharp contrast.

Figure 10B:
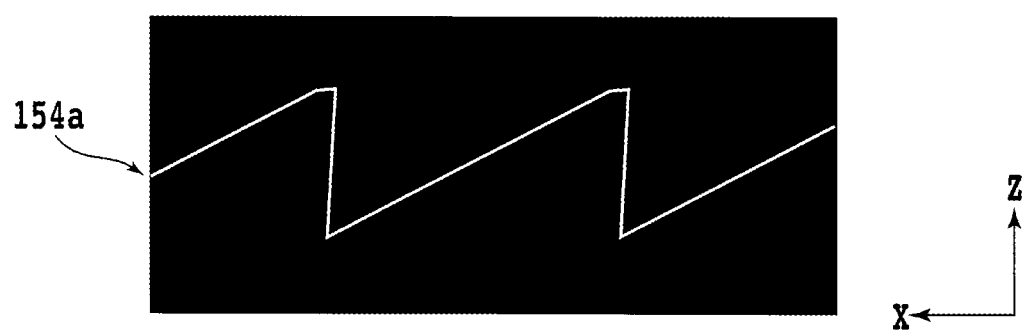
FIG. 10B is a diagram illustrating an edge-detected image.

Then, the image processing section 132*b* performs an image processing process for detecting edges in the combined image 152, i.e., an edge detecting process for detecting tip ends, i.e., cutting edges, of the cutting blade 58. When the image processing section 132*b* performs the edge detecting process on the combined image 152, the image processing section 132*b* produces an edge-detected image in which spots where the display of pixels of the combined image 152 changes from white to black are displayed in white and other areas of the combined image 152 are displayed in black, as illustrated in FIG. 10B. FIG. 10B illustrates the edge-detected image, denoted by 154. The edge-detected image 154 includes an edge line 154*a* representing the edges contained in the combined image 152. The edge line 154*a* traces the shape of the tip ends of the cutting blade 58.

Figure 10C:
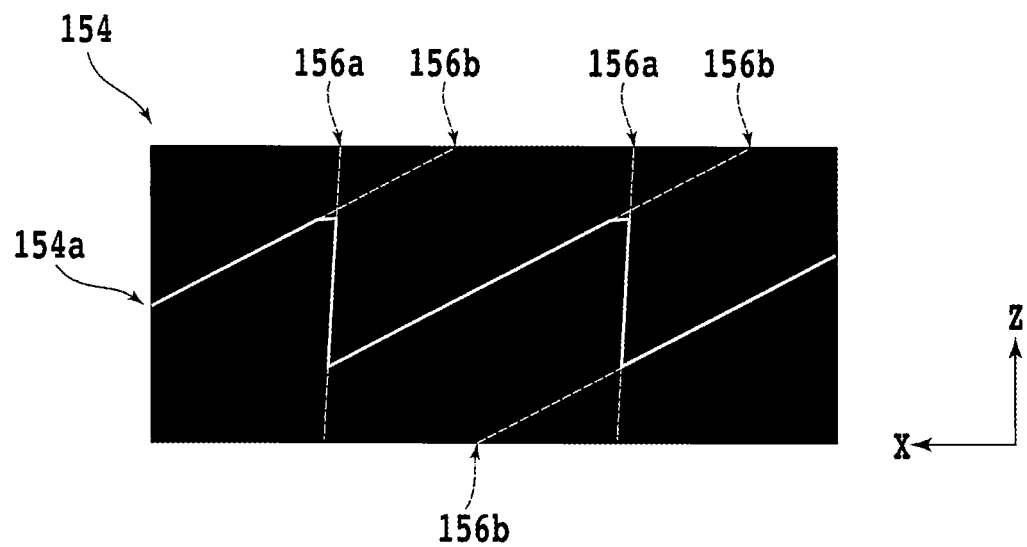
FIG. 10C is a diagram illustrating an edge-detected image on which a straight line extracting process is to be performed.

Subsequently, the image processing section 132*b* performs an image processing process on the edge-detected image 154, i.e., a straight line extracting process for extracting straight line components contained in the edge line 154*a*. FIG. 10C illustrates the edge-detected image 154 on which the straight line extracting process is to be performed.

As illustrated in FIG. 10C, the edge line 154*a* contains a plurality of components of first straight lines 156*a* corresponding to the first surfaces 60*a* (see FIG. 2B) of the cutting blade 58 and a plurality of components of second straight lines 156*b* corresponding to the second surfaces 60*b* (see FIG. 2B) of the cutting blade 58. The angle of tilt of the first straight lines 156*a* with respect to the Z-axis is smaller than the angle of tilt of the second straight lines 156*b* with respect to the Z-axis. In other words, the first straight lines 156*a* and the second straight lines 156*b* can be distinguished from each other according to their angles of tilt.

The image processing section 132*b* performs the straight line extracting process on the edge-detected image 154 to extract a plurality of straight lines contained in the edge line 154*a*. The image processing section 132*b* then specifies the angles of the extracted straight lines and classifies the straight lines into first straight lines 156*a* and second straight lines 156*b* according to their angles of tilt. For example, the image processing section 132*b* performs a Hough transformation on the edge-detected image 154, thereby extracting a plurality of straight lines contained in the edge line 154*a* and specifying the angles of tilt of the straight lines. Further, the image processing section 132*b* compares the angles of tilt of the extracted straight lines with a preset threshold value, thereby classifying the straight lines into first straight lines 156*a* and second straight lines 156*b*. Then, the image processing section 132*b* outputs an average value of the angles of tilt of the first straight lines 156*a* and an average value of the angles of tilt of the second straight lines 156*b* to the orientation determining section 132*c*.

The orientation determining section 132*c* performs an orientation specifying process for specifying the orientation of the cutting blade 58 mounted on the cutting unit 20*a*, according to the values (angles of the first straight line 156*a* and the second straight line 156*b*) input from the image processing section 132*b*. For example, the orientation determining section 132*c* determines the orientation of the cutting blade 58, according to the direction in which the second straight line 156*b* is inclined with respect to the first straight line 156*a*.

Specifically, when the cutting blade 58 is mounted on the cutting unit 20*a* such that the first surface 60*a* of each protrusion 60 is positioned forwardly of the second surface 60*b* thereof in the direction of rotation of the cutting blade 58 (see FIG. 5A), the image acquiring section 132*a* generates the edge-detected image 154 illustrated in FIG. 10C. In the edge-detected image 154, the second straight line 156*b* is inclined clockwise with respect to the first straight line 156*a* through a predetermined angle. In this case, the orientation determining section 132*c* determines that the cutting blade 58 is properly mounted on the cutting unit 20*a*, i.e., in the properly mounted state, and outputs a properly mounted signal to the operation controller 134.

On the other hand, when the cutting blade 58 is erroneously mounted on the cutting unit 20*a* such that the first surface 60*a* of each protrusion 60 is positioned rearwardly of the second surface 60*b* thereof in the direction of rotation of the cutting blade 58, the image acquiring section 132*a* generates an edge-detected image that is a horizontal reversal of the edge-detected image 154 illustrated in FIG. 10C. In the reversal of the edge-detected image 154, the second straight line 156*b* is inclined counterclockwise with respect to the first straight line 156*a* through a predetermined angle. In this case, the orientation determining section 132*c* determines that the cutting blade 58 is improperly mounted on the cutting unit 20*a*, i.e., in the improperly mounted state, and outputs an improperly mounted signal to the operation controller 134.

As described above, the image processing section 132*b* may extract the first straight line 156*a* and the second straight line 156*b* that correspond respectively to the first surface 60*a* and the second surface 60*b* of the protrusion 60 of the cutting blade 58. In this case, the orientation determining section 132*c* determines the orientation of the cutting blade 58 according to the relation of the inclinations of the first straight line 156*a* and the second straight line 156*b* that have been extracted by the image processing section 132*b*.

The determining section 132 may alternatively determine the orientation of the cutting blade 58 according to the result of a comparison between the image of each protrusion 60 of the cutting blade 58 and a reference image. In other words, the determining section 132 may determine the orientation of the cutting blade 58 according to pattern matching. Such another process of determining the orientation of the cutting blade 58 will be described below with reference to FIGS. 6 and 11A through 11C.

Figure 11A:
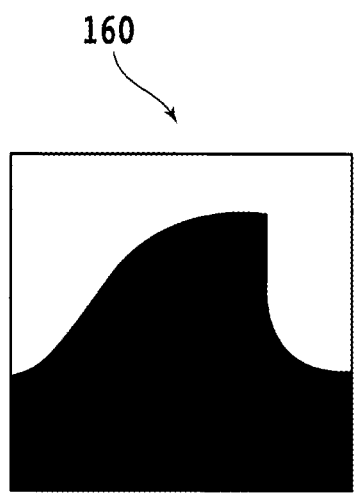
FIG. 11A is a diagram illustrating a reference image.

First, the storage section 136 of the controller 56 stores a reference image that has been acquired in advance. The reference image represents an image of a protrusion 60 that is acquired when the image capturing unit 94 captures an image of the outer circumferential portion of the cutting blade 58 when the cutting blade 58 is in the properly mounted state. FIG. 11A illustrates the reference image, denoted by 160.

Figure 11B:
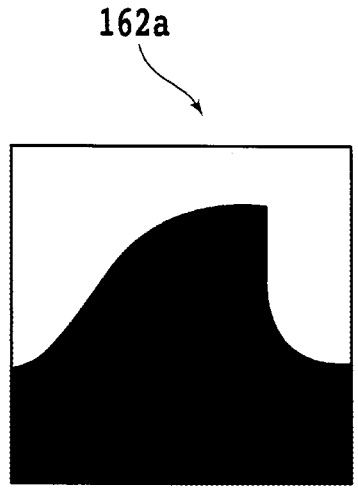
FIG. 11B is a diagram illustrating a captured image of a protrusion of a cutting blade that is properly installed.
Figure 11C:
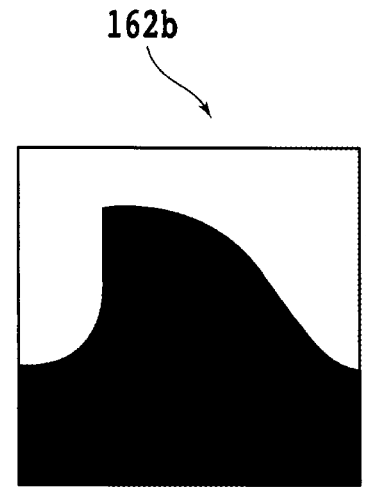
FIG. 11C is a diagram illustrating a captured image of a protrusion of a cutting blade that is installed in error.

For determining the orientation in which the cutting blade 58 is mounted on each of the cutting units 20a and 20b, the image capturing unit 94 captures an image of the outer circumferential portion of the cutting blade 58, and the image acquiring section 132a acquires the captured image. In this manner, the image of a protrusion 60 of the cutting blade 58 mounted on each of the cutting units 20a and 20b is acquired. FIG. 11B illustrates the captured image, denoted by 162a, of the protrusion 60 of the cutting blade 58 in the properly mounted state, whereas FIG. 11C illustrates the captured image, denoted by 162b, of the protrusion 60 of the cutting blade 58 in the improperly mounted state. When the image capturing unit 94 captures an image of the outer circumferential portion of the cutting blade 58, the image capturing unit 94 acquires the captured image 162a or the captured image 162b depending on how the cutting blade 58 is mounted on each of the cutting units 20a and 20b. Then, the image acquiring section 132a stores the captured image 162a or the captured image 162b that has been acquired in the storage section 136.

Next, the image processing section 132b reads the reference image 160 and the captured image 162a or the captured image 162b that have been stored in the storage section 136, and calculates a degree of similarity between the reference image 160 and the captured image 162a or the captured image 162b. When the cutting blade 58 is properly mounted on each of the cutting units 20a and 20b, the captured image 162a is acquired and compared with the reference image 160. As a result, the image processing section 132b calculates a high degree of similarity between the captured image 162a and the reference image 160. On the other hand, when the cutting blade 58 is improperly mounted on each of the cutting units 20a and 20b, the captured image 162b is acquired and compared with the reference image 160. As a result, the image processing section 132b calculates a low degree of similarity between the captured image 162b and the reference image 160. Then, the image processing section 132b outputs a signal representing the result of the comparison, i.e., the degree of similarity, between the reference image 160 and the captured image 162a or the captured image 162b to the orientation determining section 132c.

The orientation determining section 132c specifies the orientation in which the cutting blade 58 is mounted on each of the cutting units 20a and 20b, according to the result of the comparison between the reference image 160 and the captured image 162a or the captured image 162b. For example, the storage section 136 stores a threshold value for the degree of similarity in advance, and the orientation determining section 132c compares the degree of similarity input from the image processing section 132b and the threshold value read from the storage section 136 with each other. If the degree of similarity calculated by the image processing section 132b is equal to or higher than the threshold value, then the orientation determining section 132c determines that the cutting blade 58 is properly mounted on each of the cutting units 20a and 20b. On the other hand, if the degree of similarity calculated by the image processing section 132b is lower than the threshold value, then the orientation determining section 132c determines that the cutting blade 58 is improperly mounted on each of the cutting units 20a and 20b.

As described above, the image processing section 132b may compare the image of the protrusion 60 of the cutting blade 58 that has been captured by the image capturing unit 94 and the reference image with each other. The orientation determining section 132c determines the orientation of the cutting blade 58 according to the result of the comparison between the image of the protrusion 60 and the reference image.

The structure, method, etc., according to the above embodiment and modifications may be changed or modified appropriately without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus for cutting a workpiece, comprising:
   a chuck table having a holding surface for holding the workpiece thereon;
   a cutting unit having a spindle with a cutting blade mounted on a distal end thereof for cutting the workpiece held on the holding surface;
   an image capturing unit for capturing an image of an outer circumferential portion of the cutting blade mounted on the cutting unit; and
   a determining section for determining an orientation of the cutting blade,
   wherein the outer circumferential portion of the cutting blade includes a plurality of protrusions each having a first surface for scraping swarf off from the workpiece when the cutting blade cuts the workpiece and a second surface connected to the first surface, and
   the determining section determines the orientation of the cutting blade mounted on the cutting unit, according to an image captured of the protrusions by the image capturing unit.

2. The cutting apparatus according to claim 1,
   wherein the determining section determines the orientation of the cutting blade according to dimensions of the first surface and the second surface of the protrusions in the image thereof captured by the image capturing unit.

3. The cutting apparatus according to claim 1,
   wherein the determining section determines the orientation of the cutting blade according to inclinations of the first surface and the second surface of the protrusions in the image thereof captured by the image capturing unit.

4. The cutting apparatus according to claim 1,
   wherein the determining section determines the orientation of the cutting blade according to a result of a comparison between the image captured of the protrusions by the image capturing unit and a reference image.

\* \* \* \* \*